(12) United States Patent
Stowell et al.

(10) Patent No.: US 11,623,197 B2
(45) Date of Patent: Apr. 11, 2023

(54) COMPLEX MODALITY REACTOR FOR MATERIALS PRODUCTION AND SYNTHESIS

(71) Applicant: LytEn, Inc., Sunnyvale, CA (US)

(72) Inventors: Michael W. Stowell, Sunnyvale, CA (US); Bruce Lanning, Littleton, CO (US); Elena Rogojina, Mountain View, CA (US)

(73) Assignee: Lyten, Inc., San Jose, CA (US)

( * ) Notice: Subject to any disclaimer, the term of this patent is extended or adjusted under 35 U.S.C. 154(b) by 101 days.

(21) Appl. No.: 16/751,086

(22) Filed: Jan. 23, 2020

(65) Prior Publication Data
US 2021/0229061 A1 Jul. 29, 2021

(51) Int. Cl.
*B01J 19/08* (2006.01)
*B01J 19/12* (2006.01)
(Continued)

(52) U.S. Cl.
CPC ........... *B01J 19/087* (2013.01); *B01D 53/32* (2013.01); *B01J 19/126* (2013.01); *B01J 37/346* (2013.01);
(Continued)

(58) Field of Classification Search
CPC ...... B01J 19/087; B01J 19/126; B01J 37/346; B01J 2219/0869; B01J 2219/0894;
(Continued)

(56) References Cited

U.S. PATENT DOCUMENTS 4,897,281 A * 1/1990 Arai ................. H01L 21/0262
427/575
5,538,699 A 7/1996 Suzuki
(Continued)

FOREIGN PATENT DOCUMENTS

KR 100583500 B1 * 5/2006 ............... C01B 3/24

OTHER PUBLICATIONS

Tendero et al ("Atmospheric pressure plasmas: A review", Spectrochimica Acta Part B, 61, 2006, pp. 2-30) (Year: 2006).*
(Continued)

*Primary Examiner* — Alexander W Keeling
(74) *Attorney, Agent, or Firm* — Paradice & Li LLP

(57) ABSTRACT

Disclosed apparatuses, systems, and materials relate to the disassociation of feedstock species (such as those in gaseous form) into constituent components, and may include an energy generator configured to provide a microwave energy. A first chamber defines a first volume and is configured to guide the microwave energy along the first chamber as a sinusoidal wave having an energy maxima at a point along the first chamber. A second chamber contains a plasma plume and is positioned substantially proximal to the first chamber, and is configured to enable propagation of the microwave energy through the first chamber and the second chamber such that the microwave energy demonstrates, at a radial center of the second chamber, a coaxial energy maxima configured to ignite the plasma plume contained in the second chamber. Carbon-containing materials may be formed by controlling flow parameters of the feedstock species into the first or second chamber.

9 Claims, 24 Drawing Sheets

(51) Int. Cl.
  *H01J 37/32* (2006.01)
  *B01D 53/32* (2006.01)
  *B01J 37/34* (2006.01)

(52) U.S. Cl.
  CPC .. *H01J 37/32192* (2013.01); *B01D 2259/806* (2013.01); *B01D 2259/818* (2013.01); *B01J 2219/0869* (2013.01); *B01J 2219/0894* (2013.01); *B01J 2219/1218* (2013.01)

(58) Field of Classification Search
  CPC . B01J 2219/1218; B01J 19/08–19/129; B01D 53/32; B01D 2259/806; B01D 2259/818; H01J 37/32192
  See application file for complete search history.

(56) References Cited

U.S. PATENT DOCUMENTS

| | | | |
|---|---|---|---|
| 6,497,783 | B1 | 12/2002 | Suzuki et al. |
| 6,652,709 | B1 | 11/2003 | Suzuki et al. |
| 9,303,166 | B2 | 4/2016 | Walters et al. |
| 9,767,992 | B1* | 9/2017 | Stowell ............... H01J 37/3244 |
| 10,308,512 | B2* | 6/2019 | Tanner ................. B01J 8/0055 |
| 2009/0060805 | A1* | 3/2009 | Muradov ................ B01J 8/12 422/600 |
| 2012/0090782 | A1* | 4/2012 | Ikeda ................ H01J 37/32293 156/345.28 |
| 2017/0113935 | A1* | 4/2017 | Pennington ........... C01B 32/184 |
| 2021/0086158 | A1* | 3/2021 | Tranquilla ............... B01J 8/001 |

OTHER PUBLICATIONS

Dupret et al ("Highly efficient microwave coupling devices for remote plasma applications", Rev. Sci. Instrum., 65 (ii), Nov. 1994, pp. 3439-3443) (Year: 1994).*

Torrisi et al ("Non-Conventional Microwave Coupling of RF Power in ECRIS Plasmas", Proceedings of the 17th International Conference on Ion Sources AIP Conf. Proc. 2011, 020014-1-020014-3) (Year: 2011).*

Zong, S. et al., "Design of Q-Band Broadband Rectangular Waveguide TE10 Mode to Circular Waveguide TE01 Mode Converter", 27th Intl. Symposium on Space Terahertz Tech., Nanjing, China, Apr. 13-15, 2016; 4 pages.

Manawi, Y. et al., "A Review of Carbon Nanomaterials' Synthesis via the Chemical Vapor Deposition (CVD) Method", Materials, vol. 11, No. 822; (2018); 36 pages.

Ferreira, C. and Moisan, M. (eds), "Microwave discharges: fundamentals and applications", Series B: Physics vol. 302, Springer Science and Business Media; Nov. 21, 2013; 3 pages.

Butenko, Y. et al., "Photoemission study of onionlike carbons produced by annealing nanodiamonds", Physical Review B, vol. 71, No. 075420; Feb. 25, 2005; 11 pages.

* cited by examiner

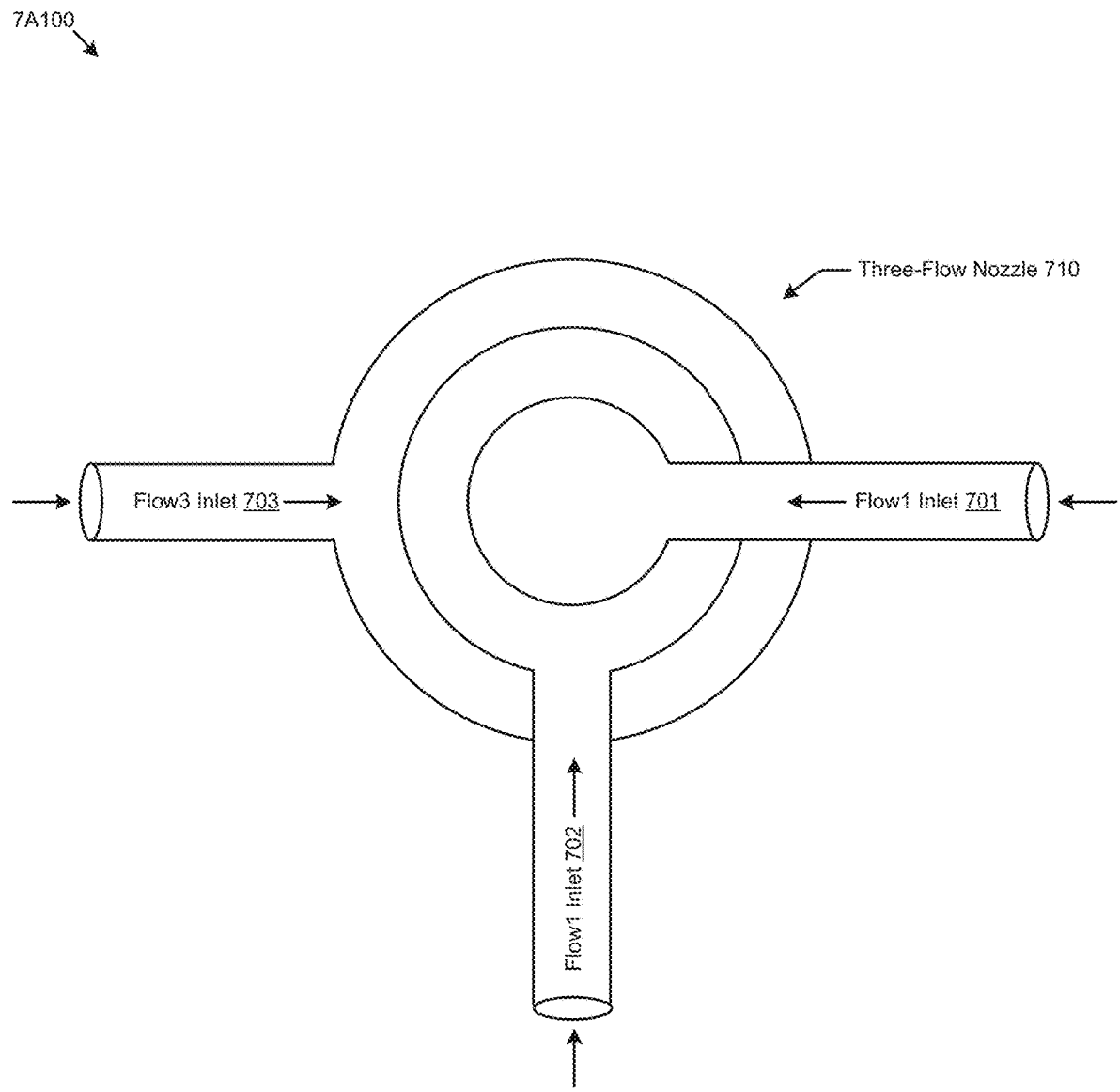
FIG. 7A1

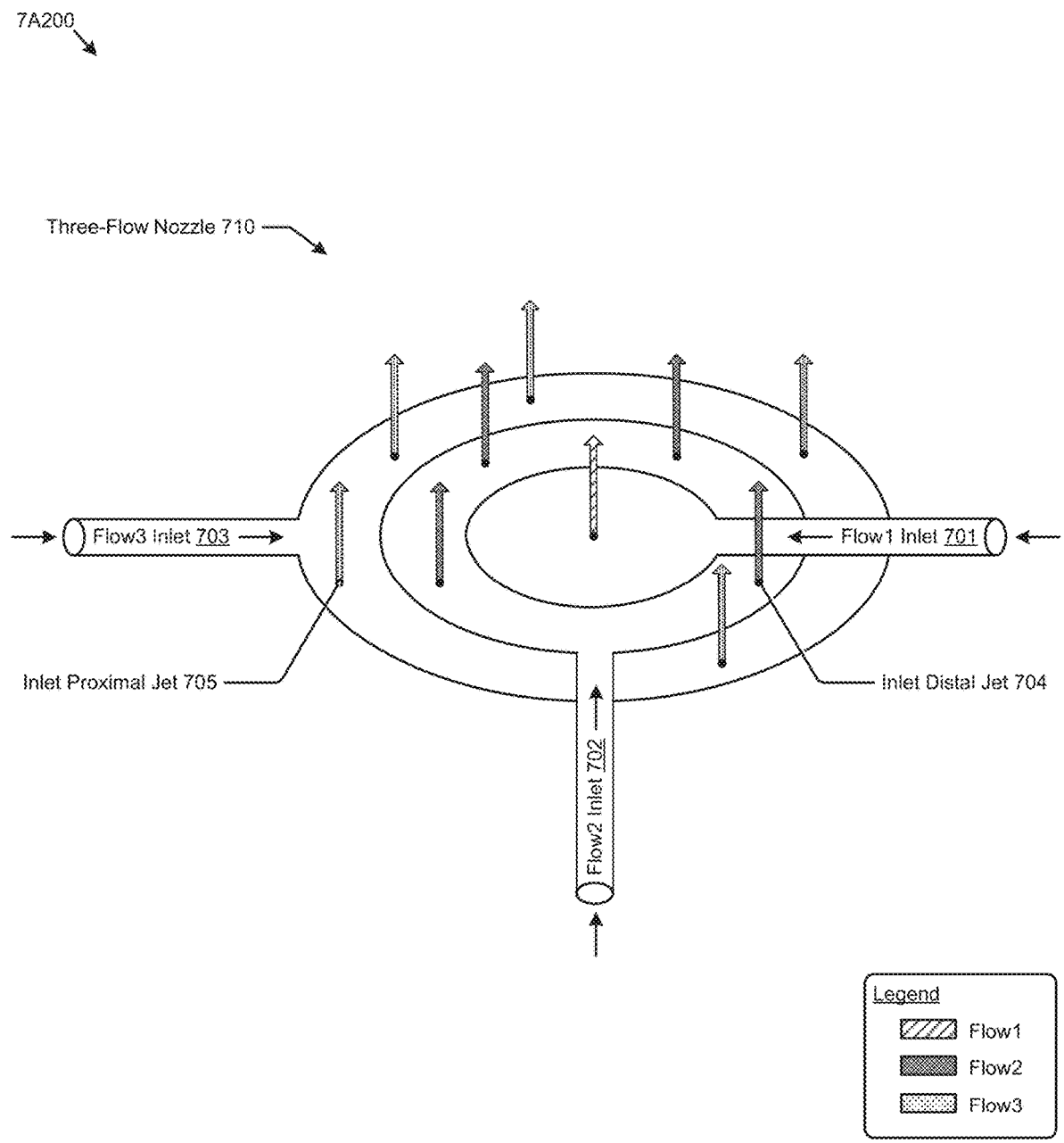
FIG. 7A2

1100

| Objective from Materials Evolution | Primary Control | Secondary Control | Example Plasma Plume Shape |
|---|---|---|---|
| Homogenous Morphologies | Narrower plasma chamber | Fewer flows (narrower range of flow variation) |  |
| Heterogeneous Morphologies | Wider plasma chamber | More flows (wider range of flow variation) |  | great # COMPLEX MODALITY REACTOR FOR MATERIALS PRODUCTION AND SYNTHESIS

TECHNICAL FIELD

This disclosure relates to molecular dissociation reactors, and more particularly to techniques for igniting and shaping a plasma plume within a molecular dissociation reactor.

DESCRIPTION OF RELATED ART

Conventional reactor designs and corresponding techniques for igniting plasmas and for controlling a plasma plume and its thermal afterglow regions exhibit many deficiencies, therefore, what is needed is a technique or techniques that address such deficiencies.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

One innovative aspect of the subject matter described in this disclosure can be implemented in an apparatus. In some implementations, the apparatus may be configured to disassociate feedstock species into constituent components, and may include an energy generator configured to provide a microwave energy; a first chamber defining a first volume and configured to guide the microwave energy along the first chamber as a sinusoidal wave having an energy maxima at a point along the first chamber; and a second chamber containing a plasma plume and positioned substantially proximal to the first chamber, the second chamber configured to enable propagation of the microwave energy through the first chamber and the second chamber such that the microwave energy demonstrates, at a radial center of the second chamber, a coaxial energy maxima configured to ignite the plasma plume contained in the second chamber.

Another innovative aspect of the subject matter described in this disclosure can be implemented in an system. In some implementations, the system may be configured to collect solids from one or more process gas species, and may include a reactor control unit configured to tune a plasma plume ignition point; a process gas control unit coupled to the reactor control unit and configured to of one or more process gas species, a control system including a microwave energy source configured to output microwave energy; and a plasma reactor coupled to the microwave energy source. The plasma reactor may include a first cavity, a second cavity coupled to the first cavity by a flange having an orifice configured to receive the one or more process gas species, and a gas-solid separator configured to separate the solids from the plasma plume. The second cavity may be configured to ignite a plasma plume at the plasma plume ignition point based on a mixture exposed to the microwave energy.

In some implementations, the apparatus may be configured to form carbon-containing materials of varying morphologies by controlling one or more flow parameters of the feedstock species into the first chamber or the second chamber. In addition, or in the alternative, the apparatus may also include at least one of a flange disposed between the first chamber and the second chamber, the flange configured to convert the sinusoidal wave to a radial wave, a reactor control unit configured to control an ignition point of the plasma plume ignition, a process control unit configured to supply the feedstock species into any one or more of the first chamber and the second chamber, or a gas-solid separator.

Another innovative aspect of the subject matter described in this disclosure can be implemented as a process for preparing an organized carbon-based material. In some implementations, the process consists of generating microwave energy using a microwave energy generator; directing the microwave energy as a sinusoidal wave through a substantially rectilinear first chamber defining a first volume; flowing a mixture of process gases into a substantially curvilinear second chamber positioned substantially proximal to the first chamber, wherein at least one gas of the mixture of process gases contains containing a non-trace quantity of carbon, directing the microwave energy through the mixture of process gases in the substantially curvilinear second chamber, the microwave energy demonstrating one or more coaxial energy maxima at one or more radial centers of the second chamber; and separating and collecting solid carbon-based materials from the mixture of process gases by igniting a plasma plume at the one or more radial centers of the second chamber and the coaxial energy maxima of the substantially curvilinear second chamber.

The first cavity may be at atmospheric pressure or at approximately 0.7 psig or may be a substantially rectilinear chamber (or both), and the second cavity may be a substantially cylindrical chamber. In some implementations, a center portion of the substantially rectilinear chamber is aligned with a center portion of the substantially cylindrical chamber along a common vertical axis. In addition, or in the alternative, the system may be configured to prevent accumulation of contaminants within the second cavity by centering the plasma plume ignition point around the common vertical axis.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

Implementations of the subject matter disclosed herein are illustrated by way of example and are not intended to be limited by the figures of the accompanying drawings. Like numbers reference like elements throughout the drawings and specification. Note that the relative dimensions of the following figures may not be drawn to scale.

FIG. 7A1 shows a top principal view of a microwave transparent, concentric three flow nozzle, according to some implementations.

FIG. 7A2 shows a bottom perspective view of a microwave transparent, concentric three-flow nozzle, according to some implementations.

DETAILED DESCRIPTION

Figure 1:
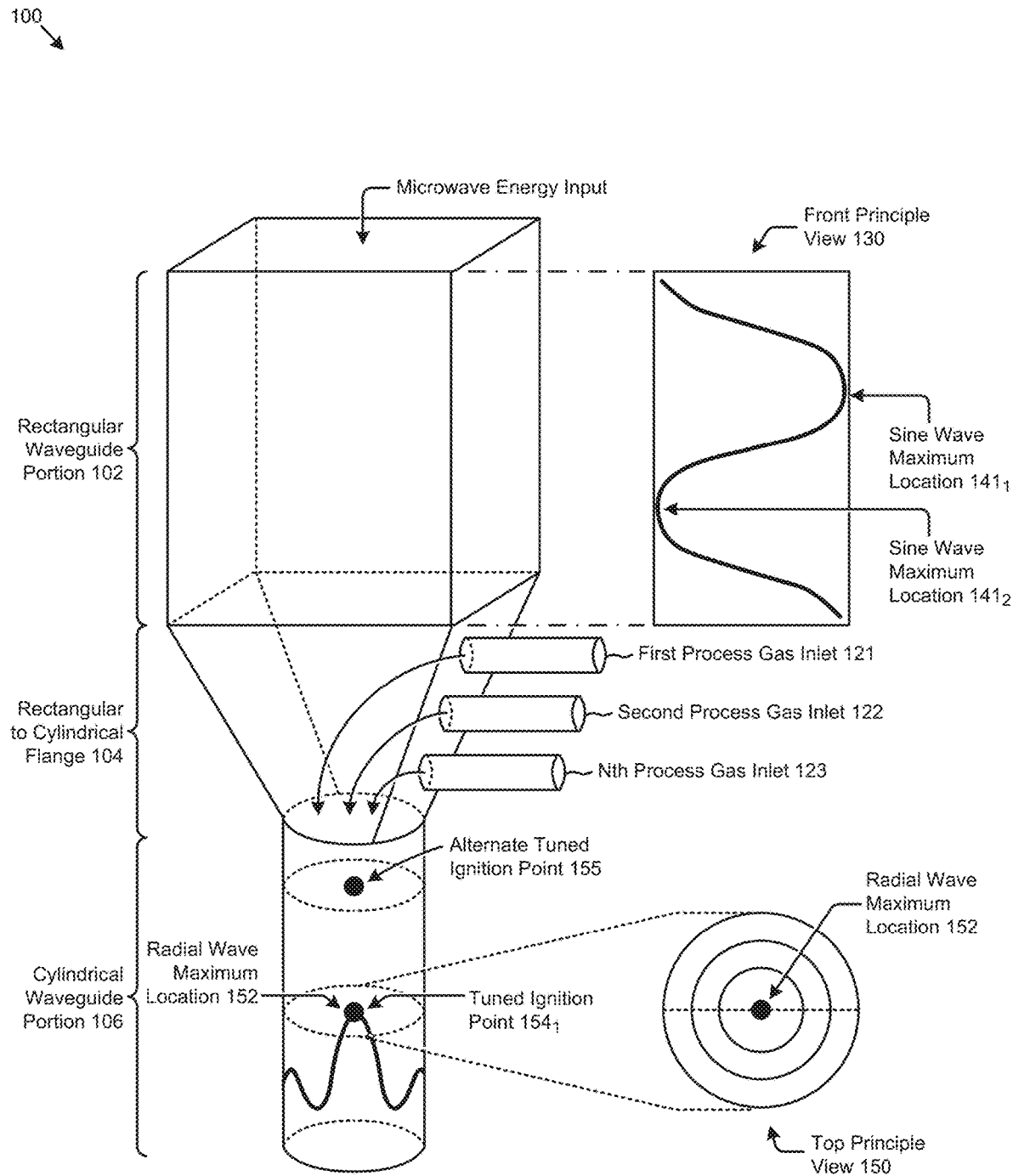
FIG. 1 shows a diagram of an apparatus configured for tuning a plasma plume ignition point, according to some implementations.

Aspects of the reactor designs and techniques of using the same disclosed herein relate to guiding non-equilibrium (referring to physical systems that are not in thermodynamic equilibrium but can be described in terms of variables, such as non-equilibrium state variables) microwave energy delivery to facilitate tunable: (1) electromagnetic propagation; and, (2) plasma properties. Tuned electromagnetic propagation with control of other reactor variables (such as flowrate of incoming feedstock gaseous species comprising one or more constituents) results in in-flight and in-reactor (also referred to as in-situ) growth and/or synthesis of new materials and/or new combinations of new materials. Certain aspects of the present disclosure address commonly encountered issues associated with controlling an ignition point and shape of a plasma plume within a plasma (or plasma-based) reactor. Some implementations are directed to approaches for concurrently controlling multiple variables that determine the shape of the plasma plume within the plasma reactor. The presently disclosed figures and discussions present example implementations, environments, systems, and methods for dissociating feedstock carbon-containing gaseous species to yield carbon-containing materials by changing microwave energy propagation modes in various in-reactor environments. At least some implementations can be realized through hardware design of the reactor, which, in turn, affects a shape and other properties of a plasma plume (generated) within the reactor.

Overview

Shape, texture, flow, temperature and physical, chemical and/or other properties of plasma plumes (referring to example processes where, during deposition, amorphous carbon can be evaporated from a solid target by a high-energy laser, ionized, and ejected as a plasma 'plume', or shape that resembles the spreading out of a feather; the plume can expand outward and deposit target material on a substrate, where plasma properties of the plume determine the quality of thin carbon-based films deposited on a substrate) in plasma reactors can be tuned for purposes of dissociating input feedstock reagent species, such as those provided in gaseous form, into constituent components (such as molecules composed of primarily hydrogen and/or carbon). Once dissociation (referring to a general process in which molecules, or ionic compounds such as salts, or complexes, separate or split into smaller particles such as atoms, ions, or radicals, usually in a reversible manner) of feedstock constituents, such as molecular components, has occurred in a plasma plume, such molecular components can be separated and further processed and incorporated into other compounds for various purposes and end-use application areas. For example, after dissociation of methane ($CH_4$) gas molecules, at least some of the dissociation products (referring to carbon, hydrogen, and derivative compounds thereof) can rearrange among themselves, leading to the controlled self-assembly (such as that from an initially formed seed particle) of carbon-containing materials to grow and/or synthesize highly organized, ornate, three-dimensional carbon-based particles, including various multi-modal structured agglomerations of few layer graphene (FLG) sheets, such agglomerations having defined ionic transport pathways to provide tunable ion conduits, and one or more channels to at least partially or temporarily confine active material (in certain end-use application areas, such as to form scaffolded electrodes for advanced lithium (Li) ion rechargeable batteries). Also, in some implementations, further mixing and/or processing of such carbon-containing materials into other materials can produce compositions of matter that exhibit unexpected favorable results and/or improved physical, chemical, mechanical, and/or other properties. In composite materials, physical and/or chemical addition of such carbon-containing products into (or incorporation within) a resin can produce composites (having multiple constituent components) that are lighter than aluminum, while being as strong or stronger than aluminum. Also, introducing carbon allotropes (such as fullerenes) into a viscous compound can result in yielding a highly effective and long-lasting lubricant.

Making such purified and functionalized carbons and/or making such carbon allotropes can, in some implementations, benefit from tight control over process variables, including (at least): the shape of the plume, temperature variations within the plume as well as other attributes of the plasma plume. Moreover, such purified and functionalized carbon and/or making such carbon allotropes can demand tight control over many process variables concurrently. And, making such purified and functionalized carbon and/or making such carbon allotropes can demand continuous and correlated control over multiple parameters within a processing reactor.

Microwave energy-based processing of hydrocarbon gasses accommodates fine-tuned control of many of the temperatures in the reactor. To illustrate, when employing such microwave processing of hydrocarbon gasses in a microwave (MW) plasma reactor, a hydrocarbon gas source is injected into the plasma environment where decomposition processes via collisions and intensified radical chemistry can take place, producing carbon atoms and various carbon-containing molecular species. The transport of these carbon-containing molecular species into the colder zones of the reactor results in the formation of solid carbon nuclei. The mainstream of carbon nuclei is then gradually withdrawn from the hot plasma region and exhausted into an outlet of the plasma stream where pristine FLG primary particles continue to grow and assemble into innately formed 3D carbon scaffolds. By tailoring the microwave plasma environment, a selective synthesis of free-standing graphene platelets and nanoparticles can be achieved.

In addition to producing innate 3D carbon scaffolds, selective elements can be incorporated into the 3D carbon scaffolds by adding these selective elements to the plasma gas stream of the reactor. The microwave plasma reactor process provides a unique reaction environment in which gas-solid reactions can be controlled under non-equilibrium conditions. Specifically, chemical reactions can be controlled by ionization potentials and by momentum energies. The foregoing ionization potentials and momentum energies can be controlled independently or in combination with each other and/or in combination with thermal energy. Reactants can be inserted as solids, liquids, or gases into the plasma reactor zone to independently control nucleation and growth kinetics of unique non-equilibrium structures (such as graphene on metal or metal on graphene). Many applications can be realized with these new types of 3D porous synthesized materials. Applications may include use of 3D porous synthesized materials in advanced energy storage devices, energy conversion devices such as fuel cells, formulations of composites materials and many other end-use application areas.

Accordingly, a reactor design for the above is desired such that the evolution produce solid materials can be controlled by controlling the shape of the plasma plume, the pressures inside the reactor, material flow rates, temperatures within the reactor, and residence times that the various species undergo as they move through a plasma plume and self-assemble.

Addressing the need for controlling the dominant process parameters that, in turn, control the evolution of solids may need to consider, that to repeatably control the evolution of solids, plasma needs to be ignited at a particular location in the reactor. More specifically, in a reactor that facilitates tightly-controlled process parameters, the desired location where a hydrocarbon plasma is optimally ignited is in the middle of the reaction chamber—as far away as possible from any reaction chamber walls. Igniting the plasma in the middle of the reaction chamber leads to several advantages: (1) plasma ignition in the center of the reaction chamber reduces carbon material deposition on the reactor walls (such as spattering), which deposition may undesirably impact reactor tunability, and, (2) plasma ignition in the center of the reaction chamber reduces the likelihood that spattered material will contaminate or otherwise undesirably affect growth phenomena and/or self-assembly phenomena that are taking place within the reactor.

Plasma Reactor Hardware Design

Disclosed herein are various implementations of a plasma reactor. The plasma reactor is constructed to include several waveguides, where the several waveguides serve cooperatively to ignite a plasma at one or more center points within a curvilinear (such as cylindrical or elliptical) portion of the plasma reactor. The specific/exact location of a plasma plume ignition point within the cylindrical portion can be tuned across a transverse axis by controlling the energy maxima of the wave within the waveguide. Additionally, the specific location of the plasma plume ignition point within the cylindrical reactor portion can be tuned across a longitudinal axis by controlling the power of the microwave energy input. Using a curvilinear reaction chamber, a plasma plume can be ignited at a location that is distal from the walls of the curvilinear portion of the plasma reactor, while at the same time, any particular plasma plume can be ignited at a location that is controllably nearer or controllably farther from an exit port of the curvilinear portion of the plasma reactor.

Also, hardware design of the plasma reactor can be relevant at least because, once ignition of plasma occurs, plasma volume can (in some instances) constrict into an undesirably small filamentary plasma. This can occur at atmospheric pressures as well as at higher than atmospheric pressures, and/or in presence of other process conditions or configurations (such as power type and power level, pressure variations within the plasma volume, input process gas types, etc.). This undesired constriction can have the consequence that much of the actual physical volume of the reactor is only partially filled by the plasma. In some conditions, the physical volume (of the reactor, or a portion thereof, etc.) that is filled by the plasma may be only about 10% or less of the volume that the hardware design of reactor can accommodate. This results in large volumes of unionized/unprocessed gas within the reactor. This leads to flowing most of the input process gas through the reactor and out an exit port even before the input process gas has had any chance to be dissociated into its constituent components. One technique to prevent this filamentary effect from occurring with corresponding undesired results involves extinguishing the plasma just at the onset of constriction and then, nearly immediately, reigniting the plasma. Using such a technique, the (relevant reactor or portion thereof) volume remains full of plasma for nearly all energy and process parameter conditions and allows for optimum flexibly in reactor design configurations and materials processing windows. To control energy and process parameter conditions, a reactor control unit is fitted onto/into the reactor to control the in-situ conditions in a manner that facilitates extinguishing and reigniting the plasma.

Plasma Reactor Flow Control

The location point of ignition of the plasma can be controlled, at least in part, by controlling flow rates of process gasses as they enter the reactor. The reactor is fitted with a gas-solid separator such that dissociated solids can be collected for further processing. Some implementations include a reactor control unit that is configured to, directly or indirectly, provide dynamic control over (at least): (1) microwave energy input, (2) the pressure of input process gasses, (3) flow characteristics (such as flow rates, turbulence, etc.) of the process gasses, (4) the temperatures at which the dissociated species are generated and then precipitated out, and (5) the residence time that the various species undergo as they move through a plasma plume.

Morphological Control of Produced Solid Matter

A plasma plume can be shaped to produce solid matter that corresponds to several heterogeneous morphologies. The plasma plume can also be shaped to produce particular forms of solid matter which particular forms of solid matter exhibit substantially homogenous morphologies.

Definitions and Use of Figures

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Thus, any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

Various implementations are described herein with reference to the figures. It should be noted that the figures are not necessarily drawn to scale, and that elements of similar structures or functions are sometimes represented by like reference characters throughout the figures. It should also be noted that the figures are only intended to facilitate the description of the disclosed implementations—they are not representative of an exhaustive treatment of all possible implementations, and they are not intended to impute any limitation as to the scope of the claims. In addition, an illustrated embodiment need not portray all aspects or advantages of usage in any particular environment.

An aspect or an advantage described in conjunction with a particular embodiment is not necessarily limited to that embodiment and can be practiced in any other implementations even if not so illustrated. References throughout this specification to "some implementations" or "other implementations" refer to a particular feature, structure, material or characteristic described in connection with the implementations as being included in at least one embodiment. Thus, the appearance of the phrases "in some implementations" or "in other implementations" in various places throughout this specification are not necessarily referring to the same embodiment or implementations. The disclosed implementations are not intended to be limiting of the claims.

DESCRIPTIONS OF EXAMPLE IMPLEMENTATIONS

FIG. 1 shows a diagram of an apparatus 100 configured for tuning a plasma plume ignition point. As an option, one or more variations of apparatus 100 or any aspect thereof may be implemented in the context of the architecture and functionality of the implementations described herein. The apparatus 100 or any aspect thereof may be implemented in any environment. FIG. 1 illustrates one reactor design that serves for controlling a plasma plume ignition point within a plasma reactor. Specifically, the figure is being presented with respect to its contribution to addressing the problem of controlling the ignition point of a plasma plume within a plasma reactor.

As shown, the apparatus 100 has three regions that are formed either in a monolithic construction (such as single piece), or as two or more components that are abutted together. As shown, a first component serves as a rectangular waveguide portion 102, which first component forms a substantially rectilinear chamber that receives microwave energy input. The top of a rectilinear-to-curvilinear flange (such as the shown rectangular-to-cylindrical flange 104) is abutted to the bottom of the rectangular waveguide portion 102 that forms a substantially rectilinear (such as rectangular-shaped, square-shaped) chamber and is also abutted to the top of the curvilinear chamber (such as the shown cylindrical waveguide portion 106) that forms a substantially curvilinear waveguide.

In some implementations, the rectangular-to-cylindrical flange 104 serves to convert the mode of the microwave propagation from a sinusoidal waveform propagation mode (such as shown by sine wave maximum $141_1$ and sine wave maximum $141_2$ within front principle view 130) to a radial waveform propagation mode (such as shown by radial wave maximum location 152 within top principle view 150). In doing so, rather than having sinusoidal energy maxima that are coincident with the walls of the substantially rectilinear portion, the coaxial energy maxima of the substantially curvilinear portion occur (or can occur) at or near the radial centers of the curvilinear waveguide portion.

A particular combination of geometries, flow rates, wavelengths, etc. will produce ignition of a plasma plume within the reactor. In this embodiment, a particular combination of geometries, flow rates, wavelengths, etc. can be configured to locate the shown tuned ignition point $154_1$ at a location that is both away from walls of the cylindrical waveguide portion 106 as well as away from the interface between the rectangular-to-cylindrical flange 104 and the cylindrical waveguide portion 106. In a different configuration a particular combination of geometries, flow rates, wavelengths, etc. can be configured to locate the tuned ignition point $154_1$ ("ignition", as referred to herein, potentially implying the igniting of combustion of supplied feedstock carbon-containing gaseous species such as methane which can, for example, change and/or dissociate into its constituent elements upon exposure to microwave energy and/or radiation as so described) at a location corresponding to alternate tuned ignition point 155.

Flow rates of (input) process gasses can influence the location of ignition. More particularly, a flow rate of a first process gas can be controlled by a first process gas inlet 121, a flow rate of a second process gas can be controlled by a second process gas inlet 122, and a flow rate of a third or Nth process gas can be controlled by a third or Nth process gas inlet 123. The combination of the process gasses can be tuned such that, for example, the first process gas is at a sufficient density and temperature so as to be dissociated into its constituent molecular components. More specifically, one possible tuning of a combination of the process gasses serves to increase plasma efficiency or plasma radical density created per unit of power input. This can be accomplished by using gases that innately produce more radicals (such as electron-ion pairs) to promote ignition and gas breakdown that cascades into a full plasma with less power input as compared to the power required in absence of the combination of the process gasses. Combination of the process gasses can be based on innate gas properties, which properties can be exploited to increase efficiency. Relevant properties include a particular gas's first ionization potential, secondary electron emission coefficient, electron-ion pair production coefficients (electrons/ion pairs per gas atom versus energy required), etc.

In an implementation, upon reaching a particular energy level and/or state (such as temperature) a molecule of hydrocarbon gas (such as methane $CH_4$) can be dissociated into one carbon atom C and two gaseous hydrogen molecules $H_2$.

In addition, or in the alternative, in some implementations, the introduction of a second and/or third process gas can function increase molecular dissociation efficiency. As one example, the addition of hydrogen gas directly into methane enhances molecular dissociation efficiency. This is due to the nature of dissociation of methane being much more efficient from energetic hydrogen cleaving of monatomic carbon from the molecules. Furthermore, when a feed gas that is weakly bonded is used, less power is required to dissociate. As an example, addition of as little as 5% hydrogen as a process gas increases plasma maintenance efficiency and resulting cracking efficiency by 50%. As another example, the addition of as little as 10% argon can raise the energy of the required discharge to increase the kinetic temperature to form higher order forms of carbon into $SP^3$ (such as bonding found in diamonds) instead of $SP^2$ (such as bonding found in graphite). More specifically, the addition of as little as 10% argon gas can, through its secondary electron emission coefficient and pair production innate to the gas leads to an increase in kinetic energy of the plasma radicals. This phenomenon can be exploited to create more robust structural carbons.

The temperatures within various cavities within the reactor can be substantially controlled by modulating the microwave energy input power and/or by modulating the flow rates of the gasses through the cylindrical waveguide portion.

Figure 2:
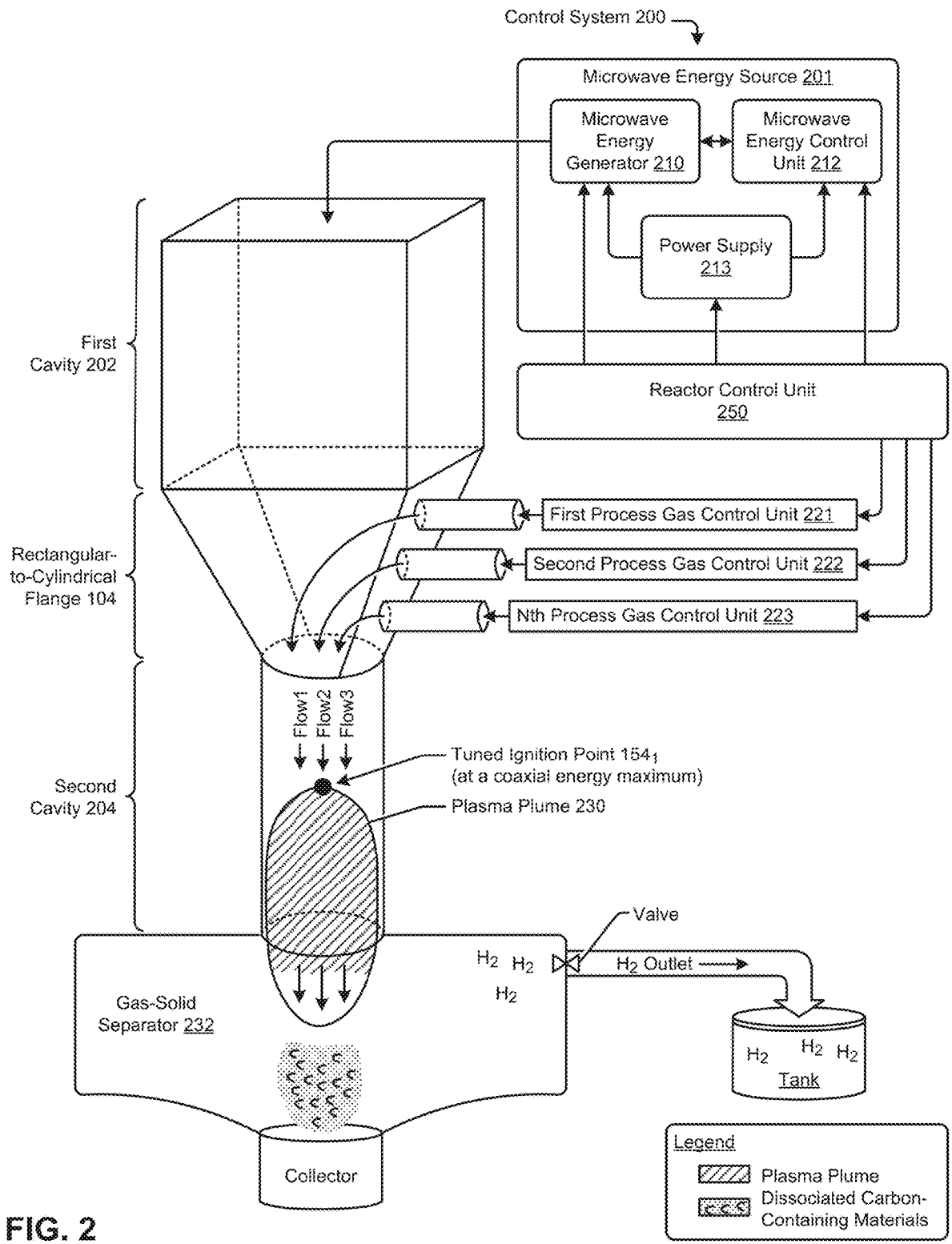
FIG. 2 depicts an example control system having a reactor control unit configured for tuning a plasma plume ignition point within a cylindrical portion of a plasma reactor, according to some implementations.

The foregoing discussion of FIG. 1 includes a specific example of dissociating a hydrocarbon gas into molecular species including hydrogen gas and carbon solids. FIG. 2 includes a reactor control unit as well as a gas-solid separator so as to produce and collect carbons in solid state, which carbons can then be further processed.

FIG. 2 depicts an example control system having a reactor control unit 250 that is configured for tuning a plasma plume ignition point within a cylindrical portion of a plasma reactor. As an option, one or more variations of the control system or any aspect thereof may be implemented in the context of the architecture and functionality of the implementations described herein. The control system or any aspect thereof may be implemented in any environment. FIG. 2 illustrates aspects pertaining to concurrently controlling multiple variables that determine a plasma plume ignition point location within a plasma reactor. Specifically, the figure is being presented with respect to its contribution to addressing the problem of controlling the ignition point of a plasma plume within a plasma reactor.

The embodiment shown in FIG. 2 is merely one example. As shown, reactor control unit 250 includes control signals that are operatively connected to: (1) a microwave energy generator 210, (b) a microwave energy control unit 212, (c) a power supply 213, (d) a first process gas control unit 221, (e) a second process gas control unit 222, and (f) a third or nth process gas control unit 223. The reactor control unit 250 can maintain independent control over any control values on any of the aforementioned control signals. As such the reactor control unit 250 provides dynamic control over (at least): (1) microwave energy input, (2) the pressure of input process gasses, (3) flow characteristics (such as flow rates, turbulence, etc.) of the input process gasses, and (4) the temperatures at which the dissociated species are generated and then precipitated out. Control of these parameters results in different residence times that the various species undergo as they move through a reactor.

In the specific embodiment of FIG. 2, a microwave energy source 201 is coupled with first cavity 202, which in turn is coupled with a rectangular-to-cylindrical flange 104, which in turn is coupled to a second cavity 204. By adjusting the aforementioned parameters, the location of a tuned ignition point $154_1$ is controllable. For example, adjusting the aforementioned parameters, a plasma plume can be ignited at an alternate tuned ignition point 155.

Upon ignition, a plasma plume 230 is formed within the second cavity. Within the plasma plume, various molecular species are formed, some of which species are gaseous, and some of which species may be present in, for example, any one or more of a liquid or solid phase. The temperatures within the second cavity decrease as a function of distance away from the ignition point. The temperatures of the various molecular species decrease as they travel through the plume, such that the plume becomes composed of only gasses and solids at the exit point of the second cavity. In this case, and as shown, the gasses and solids are processed in a gas-solid separator 232. Flow of gasses (such as $H_2$) into a tank are controlled by means of a valve at an outlet of the reactor portion that forms the second cavity. Solids (such as dissociated carbon-containing materials) are directed into a collector. In some cases, the gas-solid separator employs a gravity feed. In some cases, the gas-solid separator employs cyclonic action within one or more cyclone separators.

Further details pertaining to making and using cyclone separators can be found in U.S. patent application Ser. No. 15/725,928, filed Oct. 5, 2017, entitled "MICROWAVE REACTOR SYSTEM WITH GAS-SOLIDS SEPARATION", which is hereby incorporated by reference in its entirety.

The foregoing discussion of FIG. 2 includes the concept of controlling flows and temperatures. By controlling flow parameters as well as other parameters that correspond to the environment within various portions of the reactor (such as within the second cavity 204 of the reactor), predictable contours of temperatures result in formation of carbon-containing materials of varying morphologies. More specifically, the carbon-containing materials undergo different materials evolution as the carbon-containing materials move through the reaction chamber that forms the second cavity. Still more specifically, the carbon-containing materials move through the cylindrical portion of the shown plasma reactor via different residence paths. Each residence path is associated with a different morphology of the carbon-containing material. Temperatures associated with the various residence paths are shown and discussed as pertains to FIG. 3.

Figure 3:
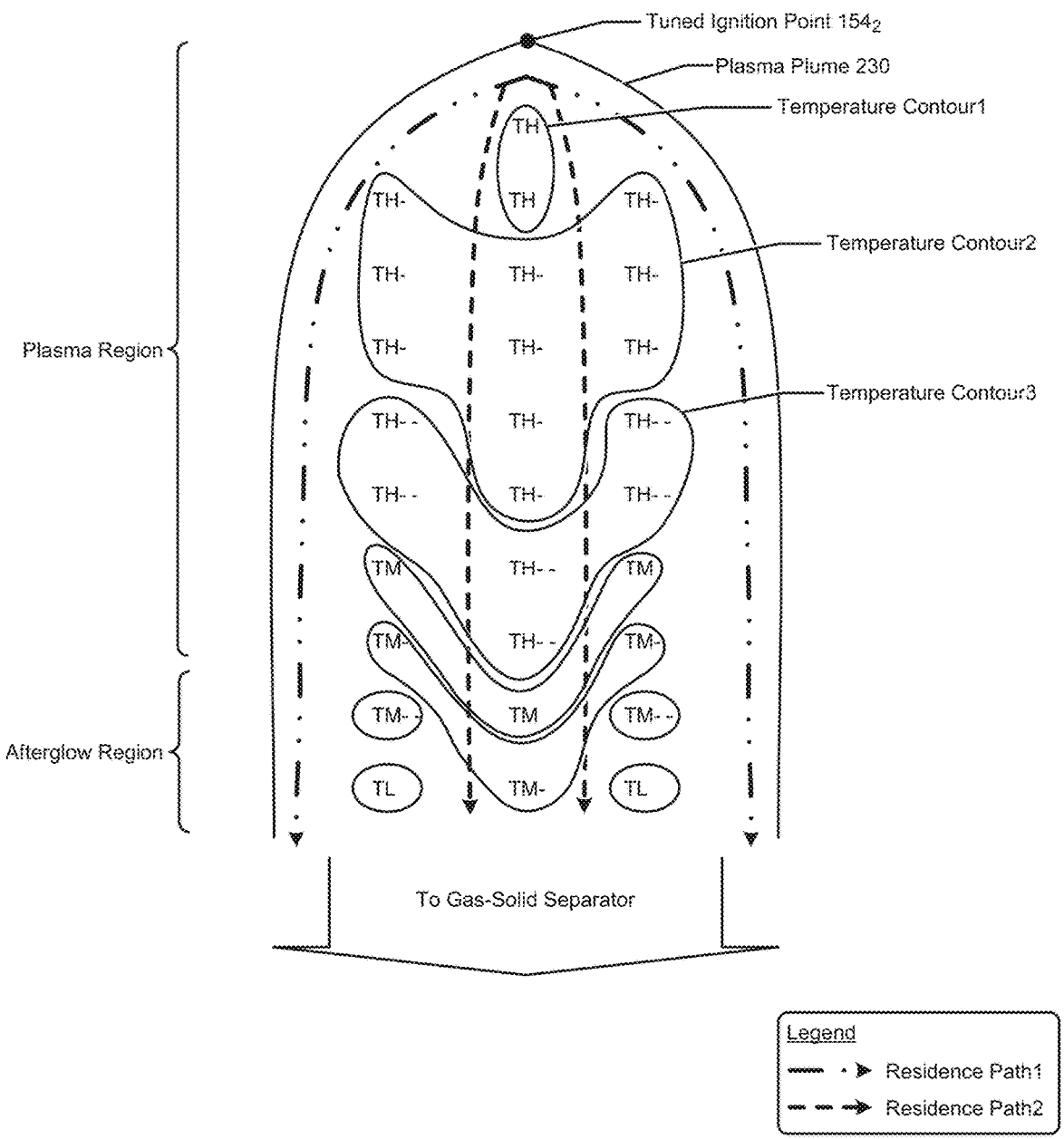
FIG. 3 shows a path diagram showing different residence paths through a cylindrical portion of a plasma reactor, according to some implementations.

FIG. 3 shows a path diagram 300 showing different residence paths through a portion, such as that having a substantially cylindrical cross section, of a plasma reactor. As an option, one or more variations of path diagram 300 or any aspect thereof may be implemented in the context of the architecture and functionality of the implementations described herein. The path diagram 300 (or any aspect thereof) may be implemented in any environment.

FIG. 3 illustrates aspects pertaining to concurrently controlling multiple variables that determine a plasma plume ignition point location within a plasma reactor. Specifically, the figure is being presented with respect to the results of controlling the ignition point (such as the lateral position of the ignition point relative to interior-facing circumferential walls or surfaces of, for example the second cavity 204 shown in FIG. 2) of a plasma plume 230 in a plasma reactor so as to cause different temperature contours in the plasma reactor. As shown, the plasma plume 230 includes both a plasma region and an afterglow region. The temperatures in the plasma region are generally higher than the temperatures in the afterglow region. Different pathways through the plasma region and into the afterglow region result in formation of carbon-containing materials that exhibit different morphologies. More specifically, the different amounts of time that materials spend traversing through the different thermal contours of the different pathways results in formation of different morphologies of carbon-containing materials.

As shown, there are several temperature contours (such as temperature countour1, temperature countour2, temperature countour3), each of which bound volumes of the same or nearly the same temperatures. As examples, the temperatures in the volume depicted by temperature countour1 are all at a high temperature (with the high temperature being denoted as "TH"), whereas the temperatures in the volume depicted by temperature countour2 are all at a slightly lower temperature than the high temperature (with the slightly lower temperature being denoted as "TH−"), whereas the temperatures in the volume depicted by temperature countour3 are all at an even lower temperature (with the even lower temperature being denoted as "TH−−"). As the molecular species of the dissociated gasses move through the various temperatures from higher temperatures "TH" through medium temperatures "TM" and through lower temperatures "TL", solids of different morphologies are formed. By tuning the ignition point as well as the flows through the plasma plume within the plasma reactor, ratios of formation of different morphologies of the solids can be controlled. This is because the mechanisms of formation of particular morphologies are related, at least in part, to residence paths.

Specifically, as the materials (such as solids as dissociated from gasses) pass from a first point within the reactor to a second point within the reactor, the materials traverse through different temperatures (inclusive of ranges or volumes of generally discrete temperatures as well as a continual temperature gradient). A specific traversal through a cavity of the reactor is characterized by specific durations of time within and through specific temperature changes. As used herein, a residence path refers to a specific traversal through a cavity of the reactor. As depicted in a first flow, molecules move thorough a first series of temperatures depicted as residence path1, which results in self-assembly of solids in a manner that corresponds to a first morphology. In a second flow, molecules move thorough a second, different series of temperatures depicted as residence path2, which results in self-assembly of solids in a manner that corresponds to a second, different morphology.

The shapes of the contours depend on many variables. Strictly as examples, the shapes of the contours can depend on the location of the tuned ignition point $154_2$ within the second cavity. Additionally, or alternatively, the shapes of the contours can depend on control of the flow, which in turn substantially controls the spatial location and temporal trajectory of the residence paths. Additionally, or alternatively, the shapes of the contours can depend on the shape of the second cavity of the reactor, which in turn substantially controls the spatial location, temporal trajectory, and other variations of residence paths. Greater (or lesser) variations between possible residence paths within the reactor corresponds to the morphological heterogeneity (or homogeneity) of the resulting carbon-containing materials (inclusive of fine-tuning of the level of contaminants, if any, in endproducts).

The embodiment shown in FIG. 3 is merely one example drawn from the reactor of FIG. 1. Other reactor designs are possible, some of which designs result in relatively greater morphological homogeneity and some of which designs result in relatively greater morphological heterogeneity. One such reactor design that results in relatively greater morphological heterogeneity is shown and discussed as pertains to FIG. 4A.

Figure 4A:
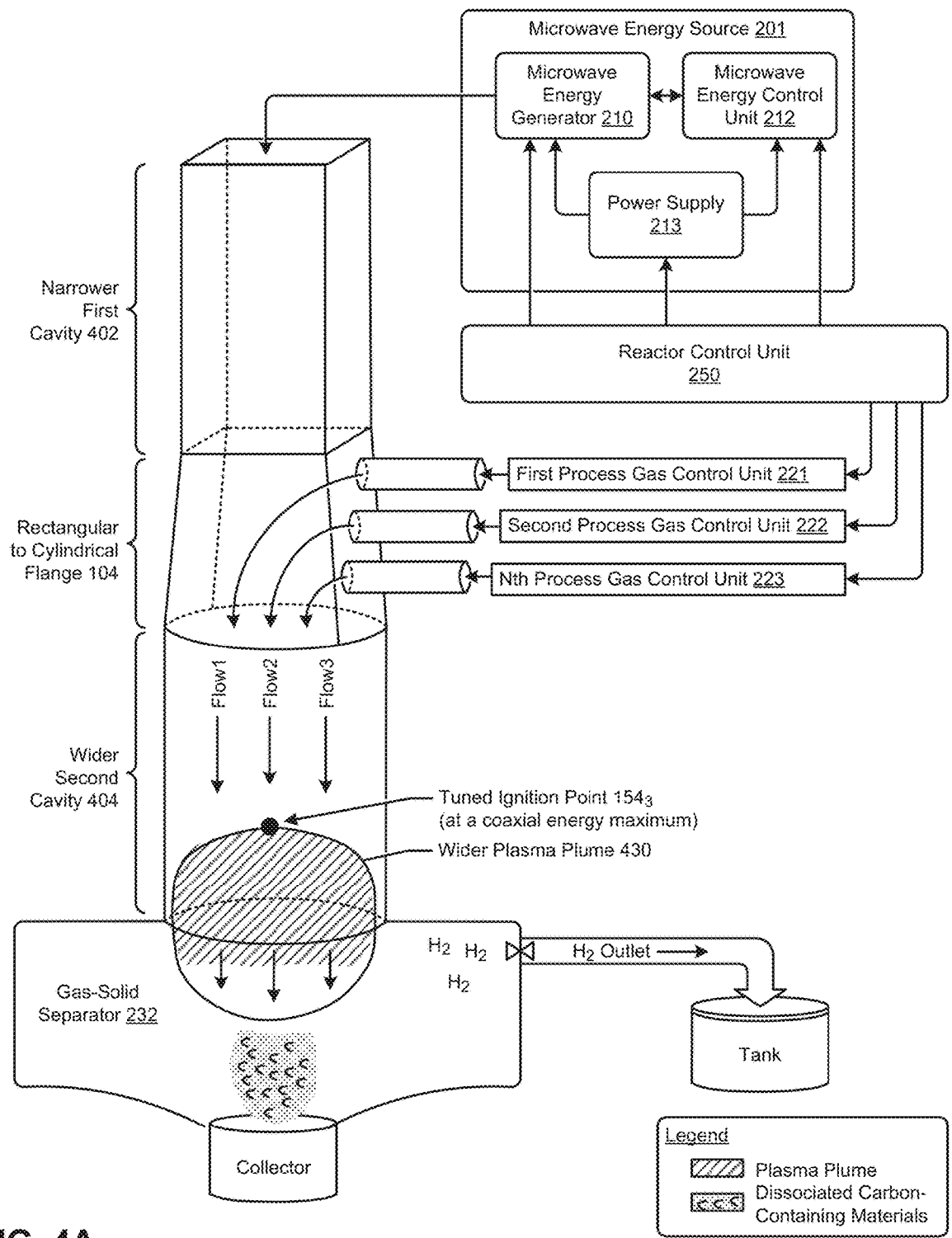
FIG. 4A, FIG. 4B, and FIG. 4C depict example control systems controlling a plasma plume within a wider cylindrical portion of a plasma reactor, according to some implementations.

FIG. 4A depicts an example control system for controlling a plasma plume within a wider cylindrical portion of a plasma reactor. As an option, one or more variations of the control system or any aspect thereof may be implemented in the context of the architecture and functionality of the implementations described herein. The shown control system in any configuration, and/or any aspect or any aspects of the control system and/or any aspects of its configuration with any reactor may be implemented in any environment.

As shown, the wider second cavity 404 is wider than the narrower first cavity 402. As a result, a wider plasma plume 430 is formed. Within this wider plasma plume 430 there are more possible residence paths through more possible temperature contours than are found in reactor designs having a relatively narrower second cavity. The occurrence of more possible residence paths results in greater heterogeneity in the morphology of the resulting carbon-containing materials.

The mechanisms that control of the number and range of variation of possible residence paths in turn correspond to control of the heterogeneity of the resulting carbon-containing materials. Strictly as one example, the reactor control unit can control the power supply to deliver more (or less) power to the microwave energy generator 210 and/or the reactor control unit 250 can control the power supply 213 to deliver more (or less) power to the microwave energy control unit 212, which in turn affects the location of tuned ignition point $154_3$. In the embodiment of FIG. 4, the tuned ignition point $154_3$ is positioned relatively lower in second cavity 404 as compared with the position of tuned ignition point $154_1$ in the second cavity 204 of FIG. 2. Other factors being constant, this results in a relatively shorter residence time, which in turn results in relatively fewer formed morphologies. On the other hand, the width of the wider second cavity 404 is relatively greater than the width of second cavity 404 of FIG. 2. Other factors being constant, this results in relatively more distinct residence paths, which in turn results in relatively more distinct morphologies of the formed materials.

As can be seen, the combination of reactor design (such as having a narrower or wider second cavity), in combination with tuning of dynamically controllable parameters, serves to achieve control over the heterogeneity or homogeneity of the morphologies of the produced carbon-containing materials. Control over the heterogeneity or homogeneity of the morphologies of the produced carbon-containing materials can be enhanced by controlling an electric field within the reactor, and/or by adding energy into the plasma plume. An example configuration of a reactor having control mechanisms for enhancing electric fields within the reactor is shown and described as pertains to FIG. 4B.

Figure 4B:
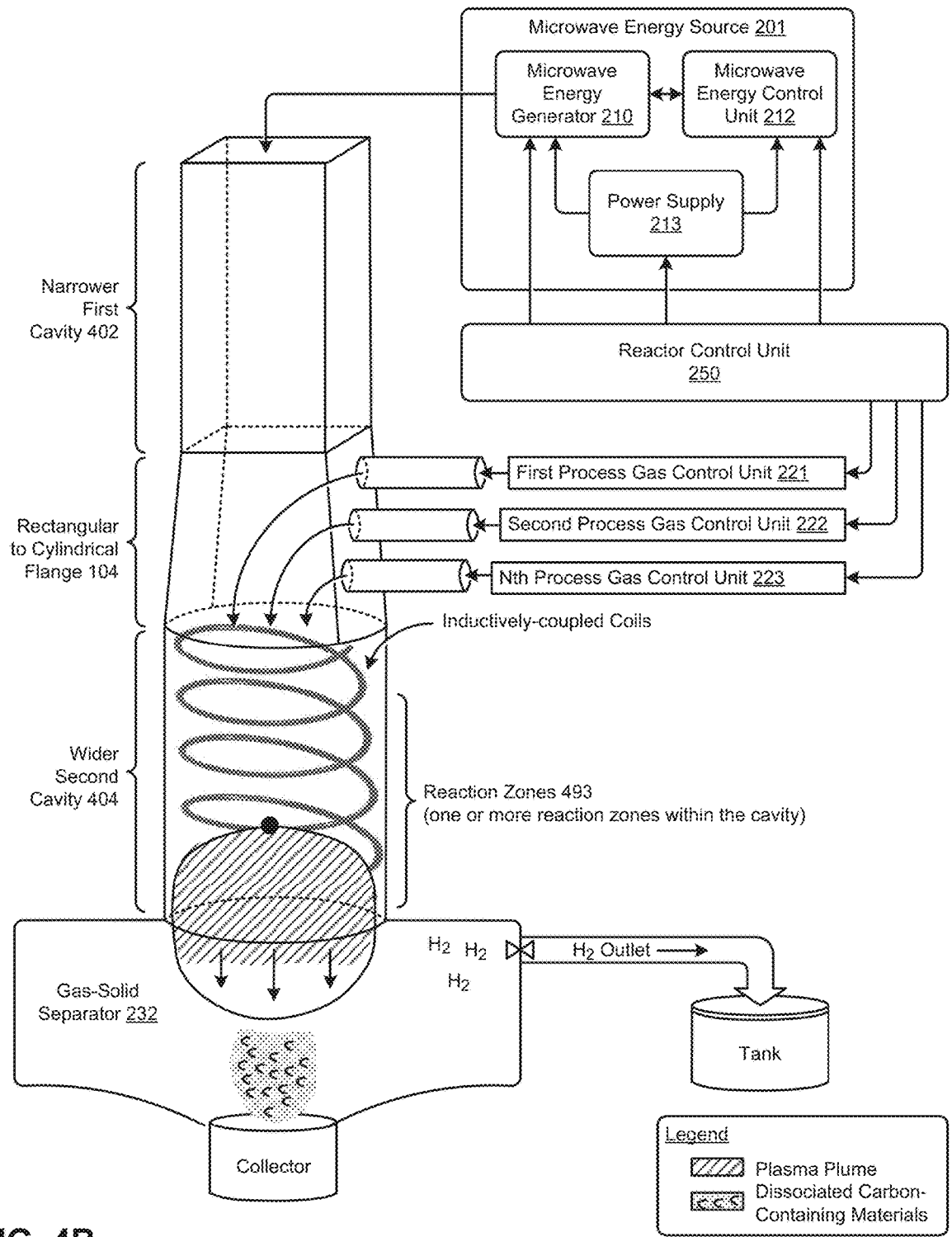

FIG. 4B depicts an example control system for controlling a plasma plume within a wider cylindrical portion of a plasma reactor. As an option, one or more variations of the control system or any aspect thereof may be implemented in the context of the architecture and functionality of the implementations described herein. Any variations of inductively coupled coils and/or any variation in the number of inductively coupled coils can be implemented with any reactor in any environment.

Inductively coupled coil(s) around the reaction zones 493 are powered via AC/RF energy including microwave energy to increase: plasma volume, promote faster plasma ignition, and/or to add energy to the gases within the reaction zones, and/or to add energy to the particles and metastable radicals within the reaction zones so as to enhance materials growth and synthesis.

Figure 4C:
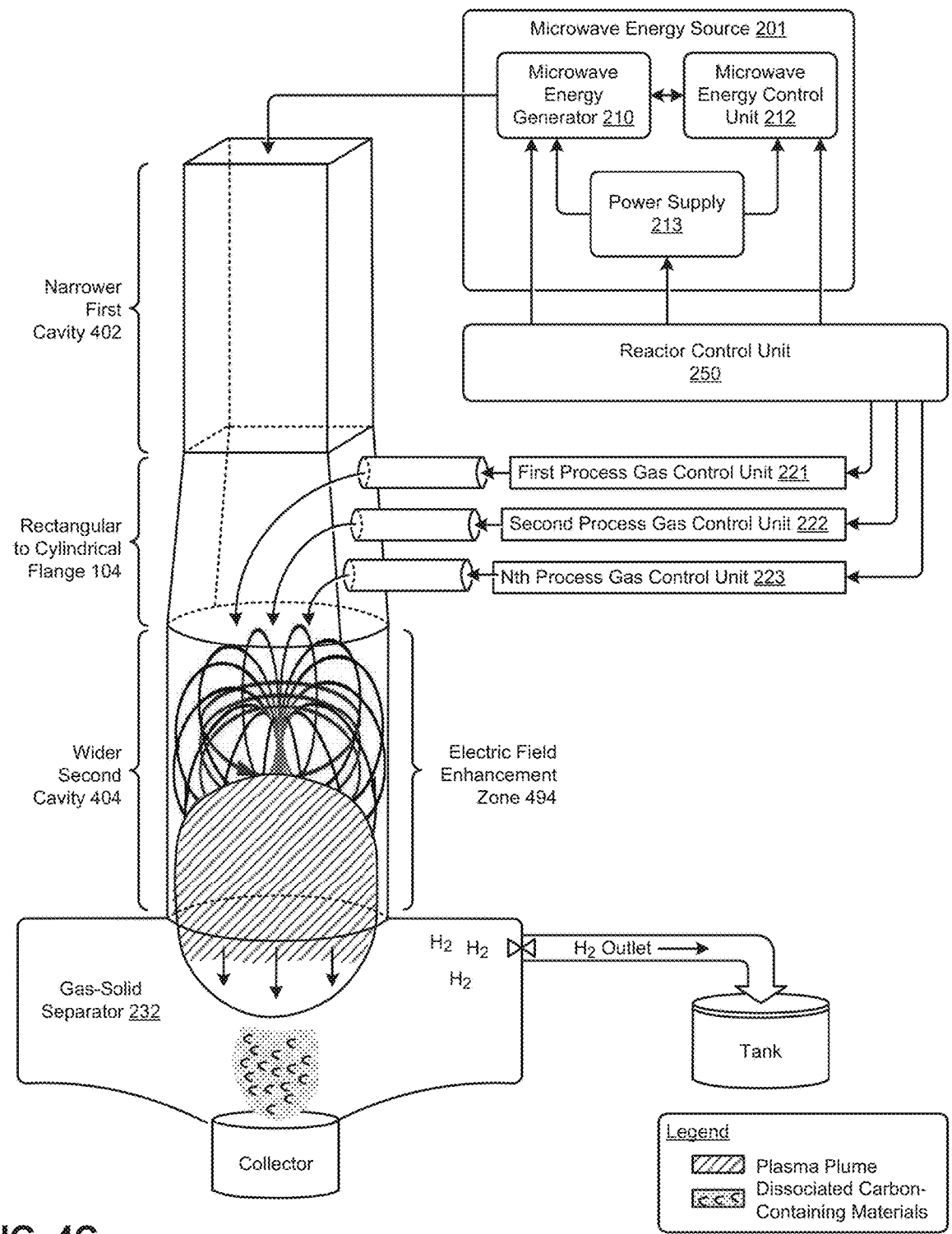

FIG. 4C depicts an example control system for controlling a plasma plume within a wider cylindrical portion of a plasma reactor. As an option, one or more variations of the control system or any aspect thereof may be implemented in the context of the architecture and functionality of the implementations described herein. An electric field enhancement can be implemented with any reactor in any environment.

In the particular embodiment shown, the reactor is fitted with one or more devices that induce one or more controllable electric fields within the electric field enhancement zone 494. Strictly as one non-limiting example, a pair of static electric fields can be induced within the cavity to form one or more reaction zones. The reaction zones can be shaped, which in turn shapes the plasma plume. Additionally, RF energy including microwave energy from any source can be tuned so as to increase energy in the plasma plume. As examples, the static electric field can be tuned to cause the plasma plume volume to increase, and/or to promote faster plasma ignition, and/or to locate one or more plasma ignition points. The foregoing RF energy including microwave energy from any source can be controlled to add energy to the gases, and/or to the particles and/or to the metastable radicals so as to enhance materials growth and synthesis.

In some implementations, the specific settings pertaining to the static electric field and the specific settings pertaining for the additional energy from any source can be configured based on (1) default settings, and/or (2) dynamically controlled settings. In some cases, the specific settings pertaining the static electric field can be configured based on specific settings pertaining for the additional energy. In some cases, the specific settings pertaining to the additional energy can be configured based on specific settings pertaining to the static electric field. Using design characteristics of and controls that are provided in the heretofore-described control system, the configuration and/or settings of any intensive and/or extensive properties of the additional energy as well as the configuration and/or settings of any the intensive and/or extensive properties of the electric field can be independently controlled.

Figure 5:
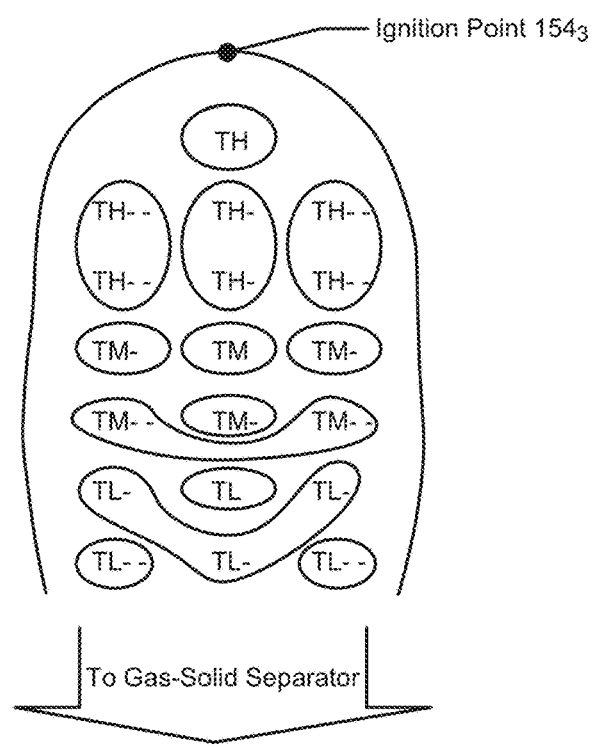
FIG. 5 shows a temperature contour map showing different temperatures within a cylindrical portion of a plasma reactor, according to some implementations.

FIG. 5 shows a temperature contour map 500 showing different temperatures within a cylindrical portion of a plasma reactor. As an option, one or more variations of temperature contour map 500 or any aspect thereof may be implemented in the context of the architecture and functionality of the implementations described herein. The temperature contour map 500 or any aspect thereof may be implemented in any environment.

The number of combinations through the distinct temperature contours of FIG. 5 is greater than the number of combinations through the distinct temperature contours of FIG. 3. Accordingly, the number of residence paths through the distinct temperature contours of FIG. 5 is correspondingly greater than the number of residence paths through the distinct temperature contours of FIG. 3. As a result, there can be many distinct morphologies that occur as a result of progression through distinct residence paths. This is shown and described as pertains to FIG. 6A and FIG. 6B. In some implementations, that shown by TH--, TH-, TH, TM--, TM-, TM, TL--, TL-, TL may be quantified in discrete or continuous temperature ranges, such as those suitable for producing desirable carbon-based or carbon-inclusive end products, including (for example): 0-100K, 0-200K, 0-300K, 0-400K, 0-500K, 0-600K, 0-700K, 0-800K, 0-900K, 0-1,000K, 0-1,100K, 0-1,200K, 0-1,300K, 0-1,400K, 0-1,500K, 0-1,600K, 0-1,700K, 0-1,800K, 0-1,900K, 0-2,000K, 0-2,100K, 0-2,200K, 0-2,300K, 0-2,400K, 0-2,500K and/or any intermediate variants thereof and/or temperatures greater than 2,500 K. Each of TH--, TH-, TH, TM--, TM-, TM, TL--, TL-, TL may vary from the next immediate temperature range identifier (such as TH—relative to TH-) by 0-50 K, 0-100 K and/or any intermediate variants thereof as may be desirable to produce desirable carbon-based or carbon-inclusive end products.

Figure 6A:
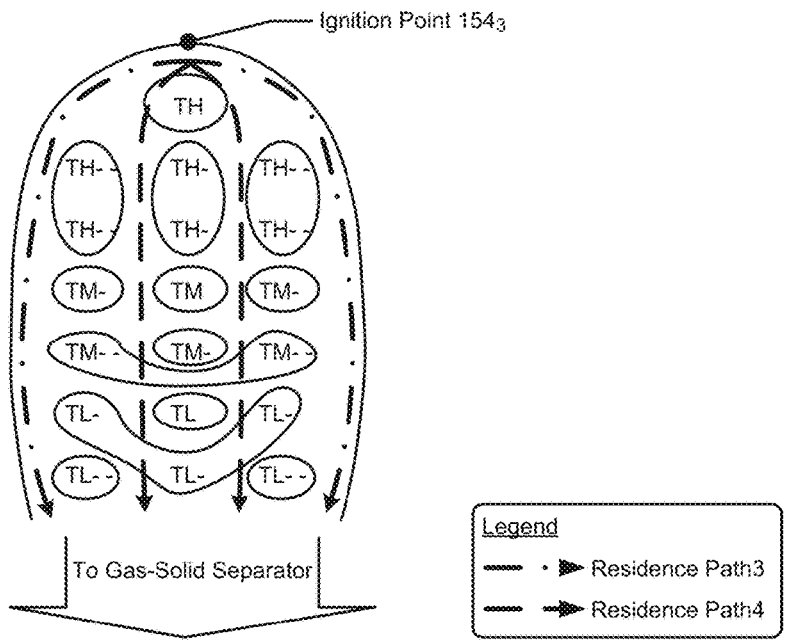
FIG. 6A and FIG. 6B show residence path diagrams that show different paths through different temperature gradients within a cylindrical portion of a plasma reactor, according to some implementations.
Figure 6B:
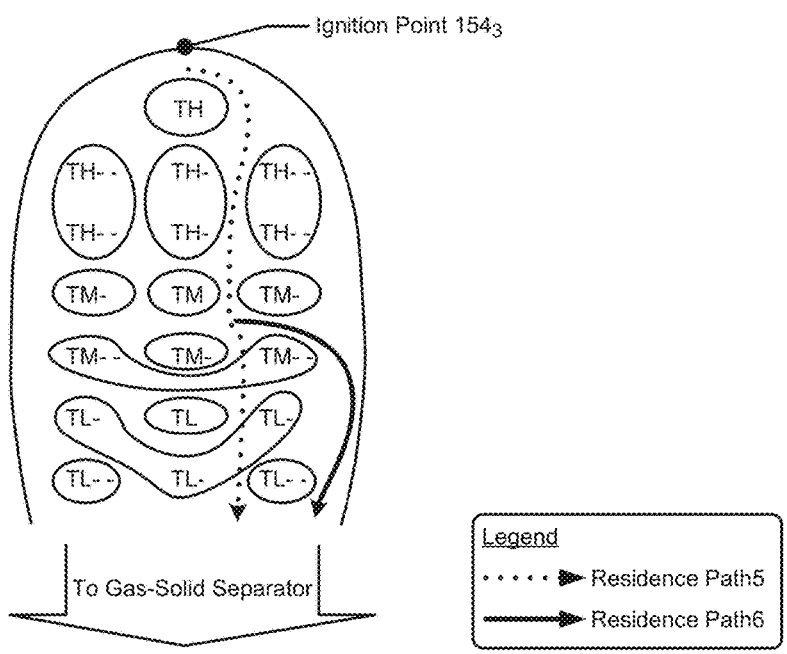

FIG. 6A and FIG. 6B show residence path diagram 6A00 and residence path diagram 6B00 that each show different paths through different temperature gradients within a cylindrical portion of a plasma reactor. As an option, one or more variations of the residence paths or any aspect thereof may be implemented in the context of the architecture and functionality of the implementations described herein. The residence paths or any aspect thereof may be implemented in any environment.

As shown in FIG. 6A, there are multiple trajectories that correspond to residence path3. This is because there are multiple possible traversals through the same series of temperature contours (such as TH, TH-, TH--, TM, TM-, TM--, TL, TL-, TL--). Similarly, there are multiple trajectories that correspond to residence path4. This is because there are multiple possible traversals through the same series of temperature contours (such as TH, TH-, TH--, TM, TM-, TM--, TL, TL-, TL--).

In some situations, the path of particular species of solid matter from the dissociation of the process gas may "jump" (referring to an abrupt or at least partially abrupt spatial transition) from one flow to another flow. This can happen when there are occurrences of turbulence in the flows. In the example shown, some solid matter of gas dissociation initially flows on the trajectory depicted as residence path5. Then, at some point, such solid matter might "jump" to the trajectory of residence path6. Such a "jump" can occur randomly (such as due to or influenced by Brownian motion), or such a "jump" can occur as a result of reactor design. For example, an obstruction can be purposely positioned in a reaction chamber of a reactor, where the obstruction is designed and positioned specifically to induce turbulence at a particular location in the reaction chamber of the reactor.

As can be seen, the control of the location of plasma plume ignition as well as the design of the reaction chamber can be tuned to support a greater number (or a fewer number) of different residence paths, which in turn serves to generate a greater number (or a fewer number) of different morphologies of solid matter.

Controlling Homogeneity of Morphologies by Controlling Homogeneity of Residence Paths The foregoing discussion of residence paths within a reactor refers to materials evolution as the materials passes through different residence paths. Specifically, the foregoing discussion explains how the evolution of the referred-to materials, such reactor-produced carbon-based materials, is affected as the materials pass through different temperature gradients. Moreover, the foregoing discusses how the physical shape of plasma plume, and therefore temperature gradients within the plasma plume can be at least partially controlled by controlling the location of the ignition point to occur at a controlled location along a longitudinal axis of the cylindrical portion of the reactor.

The aspect ratio of the cylindrical portion of the reactor affects the temperature contours within the reactor, and as such affects the materials evolution as the materials take different paths through different temperature gradients. However, controlling the aspect ratio of the cylindrical portion of the reactor (such as making the cylindrical portion relatively wider or narrower) is merely one way to control the homogeneity/heterogeneity of the possible residence paths. Another way is to control the flow rates of the materials through the cylindrical portion of the reactor. The flow rates of the materials through the cylindrical portion of the reactor can be controlled, at least in part, by controlling the flows at inlets. Additionally, or alternatively, the flow rates of the materials through the cylindrical portion of the reactor can be controlled, at least in part, by the characteristics of gas-solid separator 232 (see FIG. 2). One embodiment of a gas-solid separator 232 (such as that referring to the separation of gas and the solids that it carries by various powder processing apparatuses, methods and/or techniques) creates a specific controllable resistance to flow into the gas-solid separator, thereby providing a specific controllable back pressure.

FIG. 7A1 shows a top principal view 7A100 of a microwave transparent, concentric three-flow nozzle 710. The nozzle is formed of a rigid or semi-rigid material that is transparent to transmission of microwave energies. There are many materials that are transparent to (referring to permitting of the passage there-through with minimal or negligible transformation or interference) microwave energy. For example, and strictly by way of illustration and not to be limiting, materials used to form a nozzle may include polymeric materials. A nozzle can serve both for the purpose of creating flows of input materials such as hydrocarbon gasses or other compositions of matter or other mixtures of matter that flow fluidically, which flows are characterized by particular shapes (such as stream flows, a cylindrical curtain flows, etc.) and/or organizations with respect to each other (such as side-by-side, concentric, etc.).

In the embodiment of FIG. 7A1, the microwave-transparent, concentric three-flow nozzle 710 is capable of directing the input materials (into anyone one or more of the aforementioned reactor and/or reaction chambers) into three flow-paths (referred to herein as "flows"), where a second flow forms a first cylindrical fluid curtain that is concentric to a first flow, and where a third flow forms a second cylindrical fluid curtain that is concentric to the second flow. This is accomplished by the organization of the inlets (such as flow1 inlet 701, flow2 inlet 702, and flow3 inlet 703). The concentric organization of the several flows and the direction of the flows is shown in FIG. 7A2.

FIG. 7A2 shows a bottom perspective view 7A200 of a microwave-transparent nozzle. A plurality of orifices is depicted together with respective flow components. The orifices can be shaped into jets. Moreover, one particular jet may be of a different size and different shape as compared to another jet. This is to accommodate differences in pressure or input material velocity that may occur from one side to the other as the input material flows from the locations near the shown inlet proximal jets (such as inlet proximal jet 705) to locations near the inlet distal jets (such as inlet distal jet 704). The use of jets is strictly optional, and some implementations have no jets.

In some implementations, the microwave-transparent, concentric three-flow nozzle 710 serves as a mechanical pressure barrier to prevent plasma created in a plasma chamber of the reactor from entering or forming in a non-plasma chamber of the reactor.

Further details regarding general approaches to using microwave-transparent materials in plasma reactors are described by Stowell, et al., in U.S. application Ser. No. 16/247,002 entitled "MICROWAVE TRANSPARENT PRESSURE BARRIER", filed on Jan. 14, 2019, which is hereby incorporated by reference in its entirety. The foregoing microwave-transparent, concentric three-flow nozzle can be situated in a reactor such as is depicted in FIG. 7B.

Figure 7B:
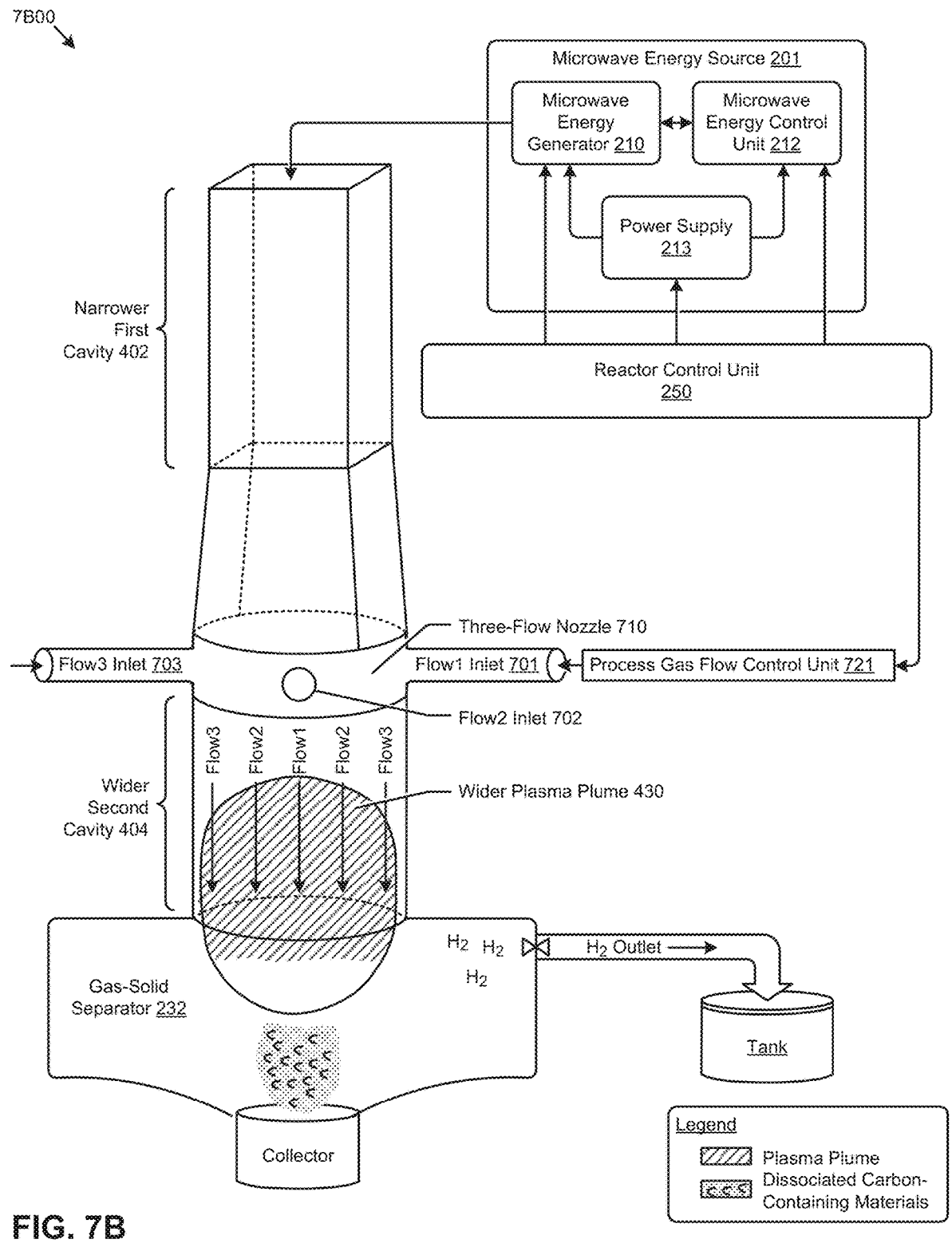
FIG. 7B depicts a three-flow plasma reactor having a microwave transparent, concentric three-flow nozzle, according to some implementations.

FIG. 7B depicts a three-flow plasma reactor 7B00 having a microwave transparent concentric three-flow nozzle 710 that is situated between a narrower first cavity 402 and a wider second cavity 740. Each of the inlets of the concentric three-flow nozzle 710 (such as flow1 inlet 701, flow2 inlet 702, and flow3 inlet 703) are controlled by its respective process gas flow control unit (such as the shown process gas flow control unit 721) to facilitate independently-controllable process gas flows through the nozzle. As an example, three process gases flow through the microwave transparent concentric three-flow nozzle 710. The orientation of the orifices of the microwave transparent concentric three-flow nozzle 710 result in an innermost (center) flow (such as flow1) and two outer flows (such as flow3 and flow2). These outer flows form curtains that are substantially concentric around the center flow (such as flow1). As such the dissociation of molecules of a process gas within a particular curtain undergoes substantially the same spatial path, and accordingly undergoes substantially the same traversal through temperature variations.

Figure 8A:
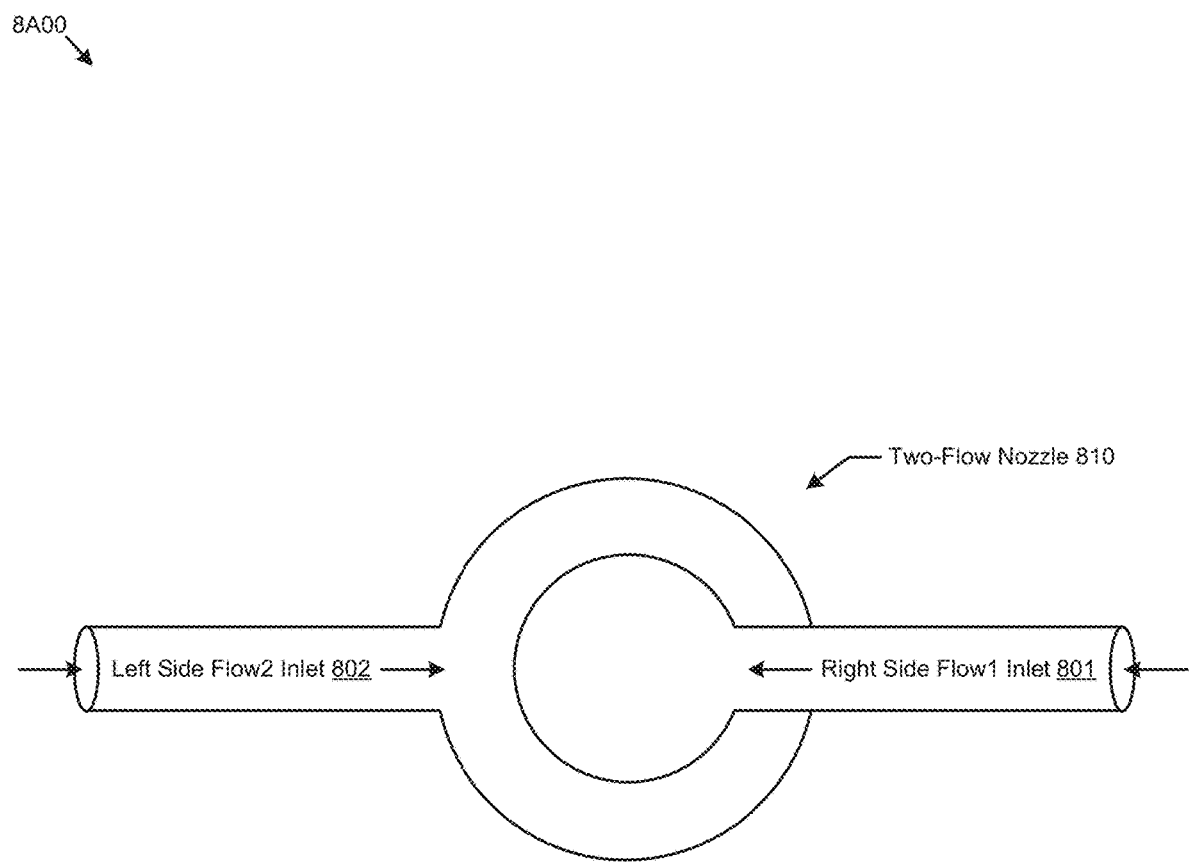
FIG. 8A shows a top principal view of a microwave transparent, concentric two-flow nozzle, according to some implementations.

FIG. 8A shows a top principal view 8A00 of a microwave transparent, concentric two-flow nozzle 810 having a left size flow1 inlet 801 and a right side flow2 inlet 802. Such a microwave transparent, concentric two-flow nozzle 810 can be used with a two-flow plasma reactor.

Figure 8B:
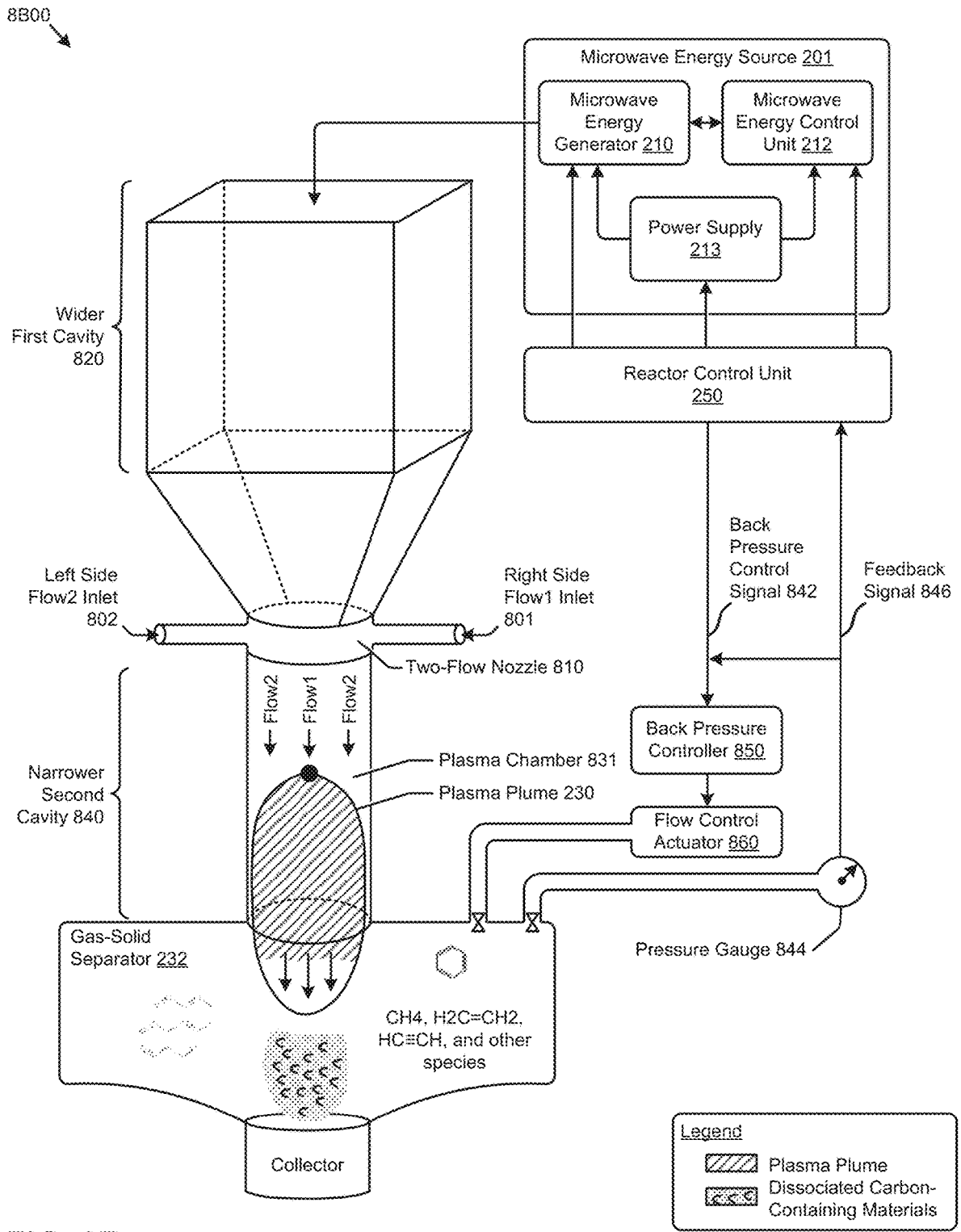
FIG. 8B depicts a two-flow plasma reactor having a microwave transparent, concentric two-flow nozzle, according to some implementations.

FIG. 8B depicts a two-flow plasma reactor 8B00 having a microwave transparent, concentric two-flow nozzle. The transparent, concentric two-flow nozzle 810 is situated between a wider first cavity 820 and a narrower second cavity 840. Furthermore, the plasma reactor 8B00 of FIG. 8B includes a gas-solid separator 232. As shown, such a separator can be equipped with a flow control device to create specific resistance to flow into the gas-solid separator 232. Such a device can be implemented using any known technique, including use of devices such as throttle valves, needle valves, or the like. Moreover, such a device can be actuated under computer control by use of the shown back pressure controller 850 and the shown flow control actuator 860. The back pressure in the reactor can thusly be controlled dynamically.

More specifically, the back pressure in the reactor can be controlled dynamically with respect to other controls. In the shown embodiment, a back-pressure control signal 842 controls the back-pressure controller and/or flow control actuator 860 while the shown pressure gauge 844 produces a feedback signal 846. As such, reactor control unit 250 has sufficient inputs and outputs to control flow into the gas-solid separator 232, which flow may be determined based on a plurality of conditions within the reactor. Controlling flow into the gas-solid separator serves to create a specific back pressure within the confines of the gas-solid separator, which in turn causes a corresponding back pressure in the plasma chamber 831. Thus, controlling the back pressure in the gas-solid separator is one way to tune flow rates and residence times, which in turn controls morphology of the materials as they form in the plasma chamber 831.

Nucleation Within the Plasma Chamber

As methane is injected and flows through a non-thermal, non-equilibrium MW plasma environment, dissociation via collisions (momentum transfer) and intensified radical chemistry occur such that carbon atoms and molecules are created to form highly ordered carbon-based structures, inclusive of mesoporous particles or agglomerations composed of multiple graphene sheets fused together to define ion conductive pathways therein. In parallel, there can also be less than ideal, thermally driven plasma heating that promotes pyrolysis reactions, possibly akin (in some implementations) to amorphous soot formation in flames, with additional contributions from oxidative reactions and intermediates that can form stacked lamellae structures similar (in appearance and/or structure) to graphite. Whereas thermal processes entail physical and reactive coalescence of large polycyclic aromatics (hydrogen abstraction acetylene addition (HACA) mechanism), non-equilibrium plasmas nucleate and grow from radical carbon atoms and molecules directly to form pristine, single and few layer graphene (FLG) platelets at much lower temperatures than their thermally derived counterparts. Hence, with an efficient plasma cracking process (such as coupling of the MW energy into the plasma for complete methane dissociation) a predominantly non-equilibrium plasma environment is created with high concentration $C/C_2$ radicals to form highly ordered single and few layer graphene with minimal pyrolytically driven, acetylene (or polycyclic aromatic hydrocarbon) addition/assembly type processes.

Further, as the process gasses flow through the cylindrical portion of the reactor, and more generally, in a gaseous medium such as is found in the reactor, pressure, temperature, concentration, and molecular mass of the gas nucleation and growth rate can be correlated to conditions at a supersaturation boundary. In many situations, there are both non-equilibrium, non-thermal plasma regions at the supersaturation boundary, often with a high ionized radical $C_2^*$ concentration. Additionally, there may be thermal plasma regions (at somewhat lower temperature) that are rich with undissociated unsaturated hydrocarbons (such as acetylene, ethylene). Each different region has conditions that are sufficiently different, and thus support different nucleation rates and growth behavior for each of the aforementioned regions. The structural order of the material (such as its morphology/crystallinity) is kinetically controlled. This can be exploited using the herein-disclosed reactors, at least inasmuch as greater order of growth features is favored at higher temperatures. Correspondingly, lesser order of growth features is favored at lower temperatures.

Returning again to the discussion of stacks, or nano platelets, as nano platelets are being nucleated, their further growth and self-assembly can define (with an unexpectedly high degree of specificity) the morphology of carbon allotropes that are being formed in the plasma chamber. Various specific morphologies result from particular process conditions within the reactor.

There are certain combinations of plasma temperatures, residence times, and process gas concentration, and other conditions that are more favorable for platelet nucleation than for carbon sheets growth. For example, lower temperatures (such as, in some implementations, 0 K-2,400K) lead to relatively higher occurrences of amorphous carbon material, (such as carbon blacks). Under these lower temperatures, relatively small $sp^2$ hybridized carbon sheets are produced, which align among each other to form stacks that are about 3 nm to about 5 nm in diameter. These stacks then self-assemble into spherical structures. Under relatively low reactor temperatures the aforementioned nano platelets remain intact, whereas, intermediate reactor temperatures often cause fusion of the edges of the nano platelets, and/or crystallization. Such fusion and/or crystallization processes result in formation of carbon allotropes generally referred to, and within the present disclosure, as carbon "nano-onions" (CNOs). A transmission electron microscopy (TEM) image showing formation of individual or fused carbon nano-onions (CNOs) is presented infra (such as see image 902 and 904 of FIG. 9A, infra).

Extended exposure of CNOs to intermediate, or higher reactor temperatures due to longer residence times in certain reactor flows causes further morphological changes. Such reactor conditions cause plasma annealing to initiate CNO polygonization and cause nanoscale structures to become ordered. These resulting polygonal cyclic structures are referred to herein as hollow carbon nano onions (H-CNOs). A TEM image showing formation of such H-CNOs is presented infra (such as see image 906 and 908 of FIG. 9B, infra).

In contrast, combination of higher plasma temperatures, specific residence times, and process gas concentration conditions that favor higher $C_2^*$ radical ion concentrations under non-equilibrium conditions, cause much more extended carbon sheet growth, and formation of much larger graphene platelets (such as from about 0.1 nm to about 1 µm in diameter) that in turn become assembled into multi-layered structures. Some of these layered structures are called "flakes". A TEM image showing formation of such "flakes" is presented infra (such as see image 910 and 912 of FIG. 9C, infra).

Figure 9A:
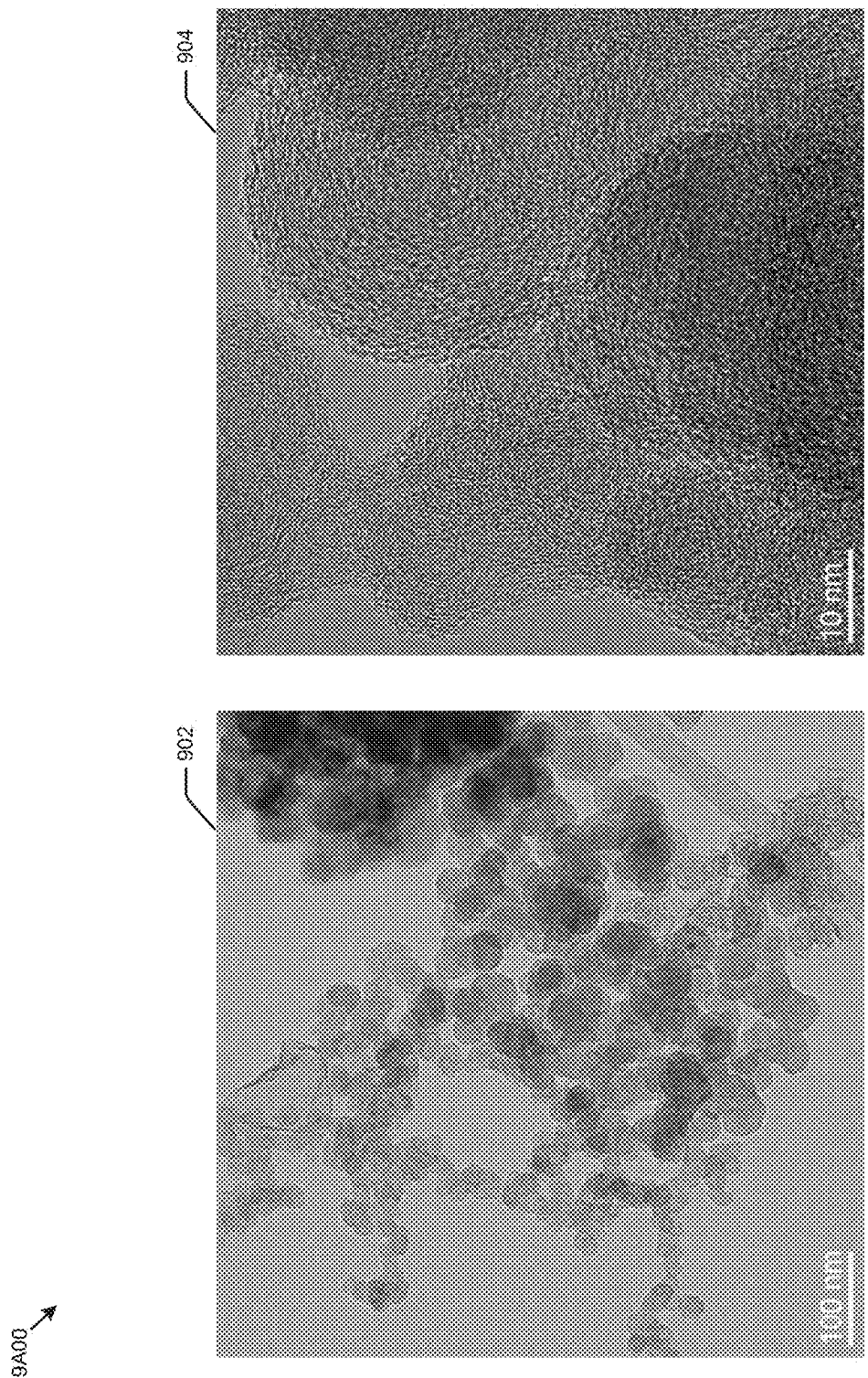
FIG. 9A shows TEM images showing carbon nano-onions (CNOs) at two different magnifications.
Figure 9B:
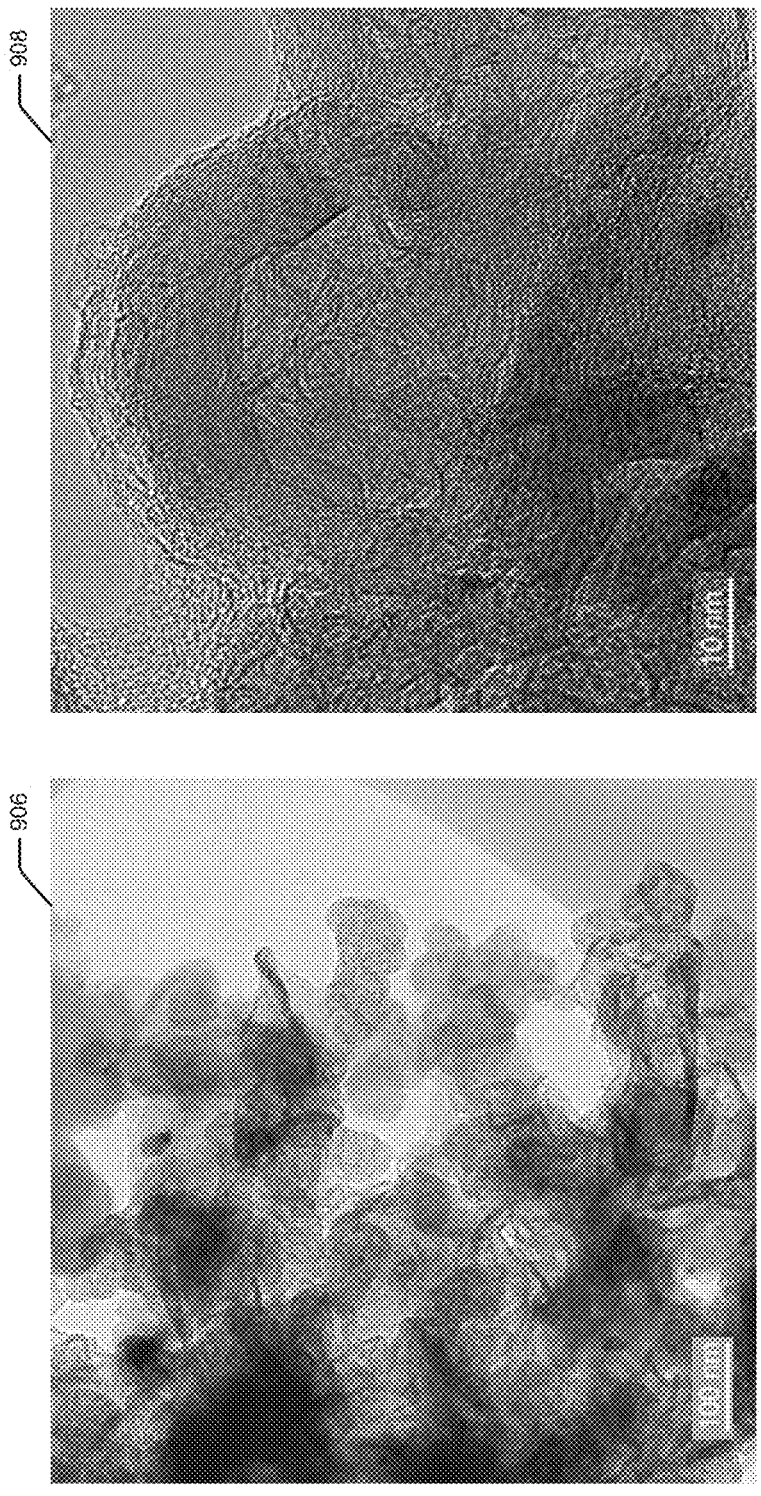
FIG. 9B shows TEM images showing hollow CNOs (H-CNO) morphology at two different magnifications.

The images of FIG. 9A and FIG. 9B depict materials formed at relatively lower reactor temperatures under shorter and longer residence times respectively. The image of FIG. 9C depicts material formed at relatively higher reactor temperatures, and with higher $C_2^*$ radical ion concentrations under non-equilibrium conditions.

FIG. 9A shows TEM images 9A00 showing carbon nano-onions (CNOs) at two different magnifications. The CNOs are shown at a 200 nm scale (image 902) as well as at a 20 nm scale (image 904). As indicated above, the carbon nano-onions of FIG. 9A are formed at relatively lower temperatures, and with shorter residence times.

FIG. 9B shows TEM images 9B00 showing H-CNO morphology at two different magnifications. The H-CNO morphology is shown at a 100 nm scale (image 906) as well as at a 10 nm scale (image 908). In some cases, the H-CNO morphology resembles an amorphous core structure surrounded by a lamellae shell.

Figure 9C:
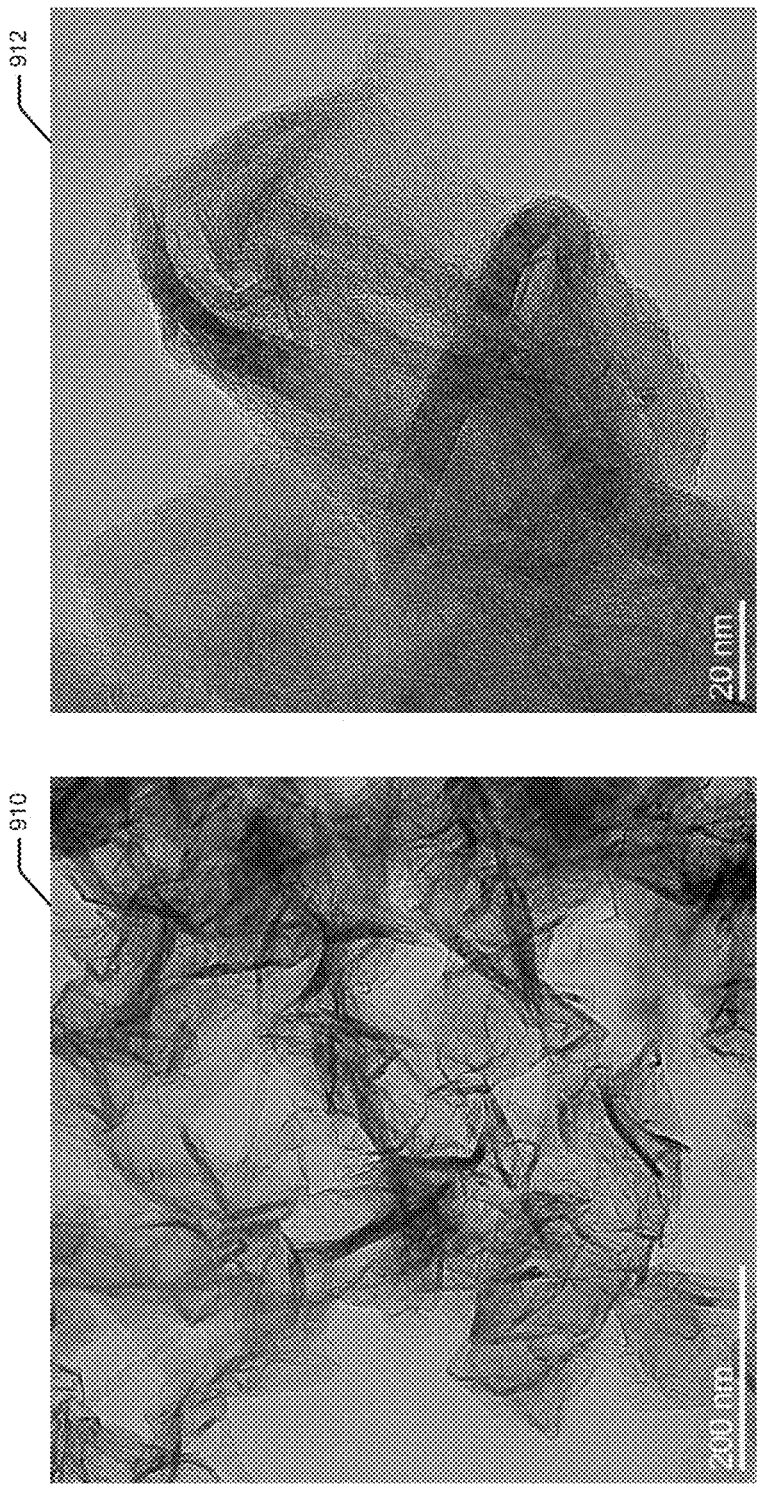
FIG. 9C shows TEM images showing graphene flakes morphology at two different magnifications.

FIG. 9C shows TEM images 9C00 showing graphene flakes morphology at two different magnifications. The graphene flakes are shown at a 200 nm scale (image 910) as well as at a 20 nm scale (image 912). Graphene flakes having the shown morphology are formed at higher $C_2^*$ radical ion concentrations under non-equilibrium conditions. Such non-equilibrium conditions arise from the microwave-generated plasma. It is such non-equilibrium conditions that enables graphene structures to be formed at lower temperatures—when formation is governed by kinetic energies (such as momentum) rather than by thermal energies (such as temperatures).

Figure 9D:
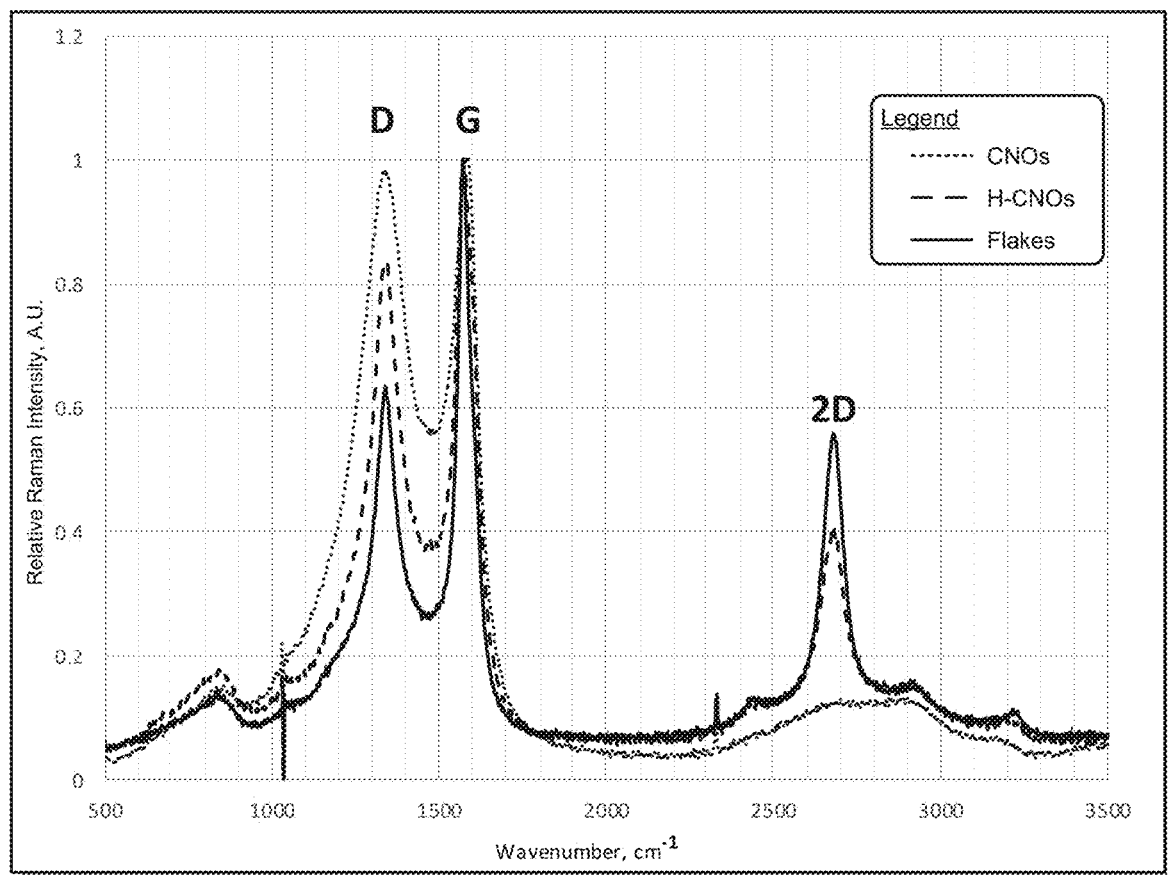
FIG. 9D shows a plot comparing Raman spectra for three different morphologies.

FIG. 9D shows a plot 9D00 comparing Raman spectra for three different morphologies (referring to that able to be produced by any one or more of the aforementioned reactors). As can be seen, the three different morphology types—CNOs, H-CNOs and flakes—each exhibit very different Raman spectra. Specifically, variations in morphology are exhibited by representative Raman spectra having distinct differences in intensities of D, G and 2D peaks for each given morphology type. The plot shows differences in corresponding Raman spectroscopy using a 532 nm excitation laser.

In multi-layer graphene, the Stokes phonon energy shift caused by laser excitation creates three main peaks in the Raman spectrum. A G (~1580 cm-1), a primary in-plane vibrational mode, and 2D (~2690 cm-1) bands are Raman signature of graphitic sp2 materials. As the amount of sp2 bonded planar graphene sheets, or layers in a stack increases, G peak experiences a small red shift, while 2D peak becomes wider, shorter, and shifts to higher frequency position. A second-order overtone of a different in-plane vibration, D (1350 cm-1) reflects a disorder in a graphene layer. As the amount of disorder in graphene increases, the Raman intensity of D peak increases. Thus, differences in morphology of carbon solids can be ascribed by the ratios of D, G and 2D peak intensities D:G and 2D:G. As a solid becomes more crystalline, D:G ratio decreases, while fewer layers increase 2D/G ratio. Thus, a solid with flaky morphology is characterized by lowest D/G ratio, and highest 2D/G ratio. However, as a solids crystallinity decreases, D/G ratio increases significantly, while 2D peak intensity become negligible.

Figure 10:
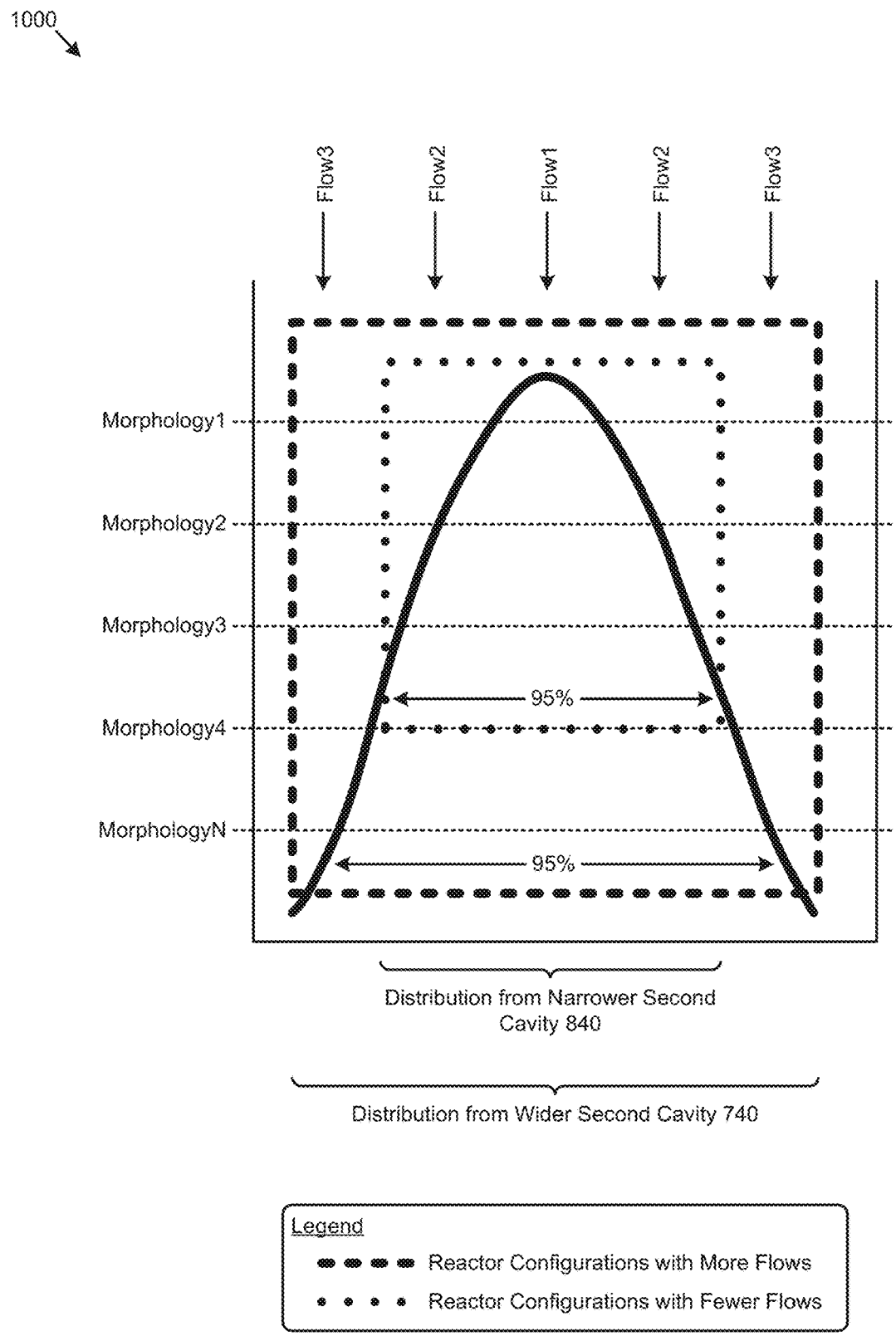
FIG. 10 shows a heterogeneous material distribution graph, according to some implementations.

FIG. 10 shows a heterogeneous material distribution graph 1000. As a result of traversal through the different residence paths that arise from the combination of spatial, temporal and temperature variations between the paths, different morphologies of the solid matter described above are being formed. For example, based on a first residence path having a first combination of spatial, temporal and temperature variations, solid matter having morphology 1 is formed, whereas, based on a second residence path having a second combination of spatial, temporal and temperature variations, solid matter having morphology 2 is formed, and so on. As such, the different morphologies are not related strictly to the different flows in a one-to-one correspondence, but rather to the combination of spatial, temporal and temperature variations. Although the flows as shown and described supra are shown as discrete flows (such as flow1, flow2, flow3, etc., any one or more of the aforementioned discrete flows having quantifiable flow rates set at, for example, 0-5 slm, 0-10 slm, 0-20 slm, 0-20 slm or more depending on desired end products, etc.), it is known in the art that the flows interact with each other to form a continuum of flows. Moreover, the flows as depicted in the foregoing figures are not necessarily to scale, nor are the actual flows necessarily positioned as shown.

Figure 11:
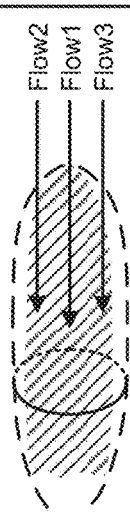
FIG. 11 shows a materials evolution tuning chart depicting primary and secondary controls that correspond to a materials evolution objective, according to some implementations.
Figure 11:
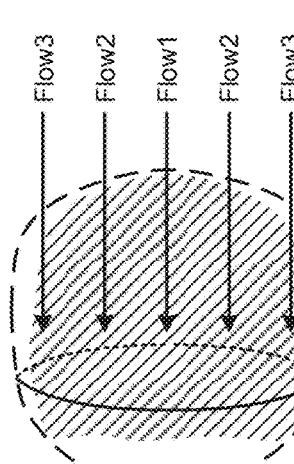

FIG. 11 shows a materials evolution tuning chart 1100 depicting primary and secondary controls that correspond to a materials evolution objective. As shown, if the materials evolution objective is to produce materials that are within a narrow band of homogeneity, then, as a primary control, a reactor having a relatively narrower plasma chamber is used. On the other hand, if the materials evolution objective is to produce materials that are distributed throughout a wide band of homogeneity, then a reactor having a relatively wider plasma chamber is used. The materials evolution tuning chart 1100 also depicts how a materials evolution objective can be tuned through use of flow control. As shown, if the materials evolution objective is to produce materials that are within a narrow band of homogeneity, then, as a secondary control, a reactor having relatively fewer discrete flows is used. On the other hand, if the materials evolution objective is to produce materials that are distributed throughout a wide band of homogeneity, then, as secondary control, a reactor having relatively more discrete flows is used. Regardless of preferred homogeneity, both narrower and wider plasma chamber configurations can be configured to accommodate adjustment of reactor conditions to trigger an occurrence of a plasma plume at substantially center (referring to a laterally positioned radial center, relative to the second cavity 204) to reduce occurrence and/or generation of unwanted contaminant species and/or particles within collected processed carbon-based materials. Placement of the plasma plume at the substantial center (as discussed) guards against unwanted deposition of carbon-based materials along-side and/or on interior-facing walls or surfaces of the second cavity 204, essentially serving to otherwise 'clog-up' the second cavity 204 and potentially lead to irregularities in plasma plume formation, expansion, and carbon-based material deposition.

In addition to the number and juxtaposition of flows within the reactor, other intra-reactor conditions can be controlled. The homogeneity/heterogeneity of the resulting solid matter depends on such intra-reactor conditions. Table 1 (included below) depicts two examples of intra-reactor conditions and respective solid matter. Specifically, the first row of Table 1 depicts specific intra-reactor conditions used to create solid matter 'A' as well as characteristics of solid matter 'A'. Similarly, the second row of Table 1 depicts specific intra-reactor conditions used to create solid matter 'B' as well as characteristics of solid matter 'B'.

TABLE 1

Experimental conditions and results

| Solid Matter ID | Ar (slm) | N2 (slm) | CH4 (slm) | H2 (slm) | Total (slm) | Supply Power (W) | Reactor Average Pressure (psig) | D:G | 2D:G |
|---|---|---|---|---|---|---|---|---|---|
| A | 30 | 10 | 15 | 0 | 55 | 3,000 | 5 | 0.71 | 0.37 |
| B | 30 | 10 | 15 | 0 | 55 | 3,000 | 0.7 | 0.55 | 0.54 |

In the example experiments for creating solid matter 'A' and solid matter 'B', all of the intra-reactor conditions were held constant between the two experimental runs except the intra-reactor pressure. While carrying out these two experimental runs, the back pressure of the gas-solid separator is controlled such that the average intra-reactor pressure is controlled as shown in Table 1. Specifically, when generating solid matter 'A', the reactor average pressure is 5 psig, whereas when generating solid matter 'B', the reactor average pressure is 0.7 psig. Matter 'A' is composed of solids having lower crystallinity, which is characterized by significantly higher D/G ratio, and lower 2D/G ratio. Matter 'B' is a highly crystalline homogeneous solid composed of graphene flakes. Matter 'B' has lower D/G ratio, and higher 2D/G ratio as compared with matter 'A'. An increased intra-reactor pressure causes significant drops in internal reactor temperatures and significant increases in residence times on paths between a center of the plasma chamber and its periphery. Thus, while flakes are forming in the center of the plasma chamber, localized areas away from the center are created under conditions favoring CNOs and H-CNOs morphologies formation (such as lower temperatures, and shorter or longer residence times respectively). Alternatively, a much lower reactor pressure allows for tighter control of temperature and gases flow contours. This enables time-wise maintenance of the conditions favorable for flakes formation throughout the entire chamber.

Moreover, the differences in morphologies between the two resulting solid matter resultants are visible in TEM images. To illustrate, images of solid matter 'A' are shown and described as pertains to FIG. 12A and images of solid matter 'B' are shown and described as pertains to FIG. 12B.

Experiment 1: Higher Reactor Pressure

Figure 12A:
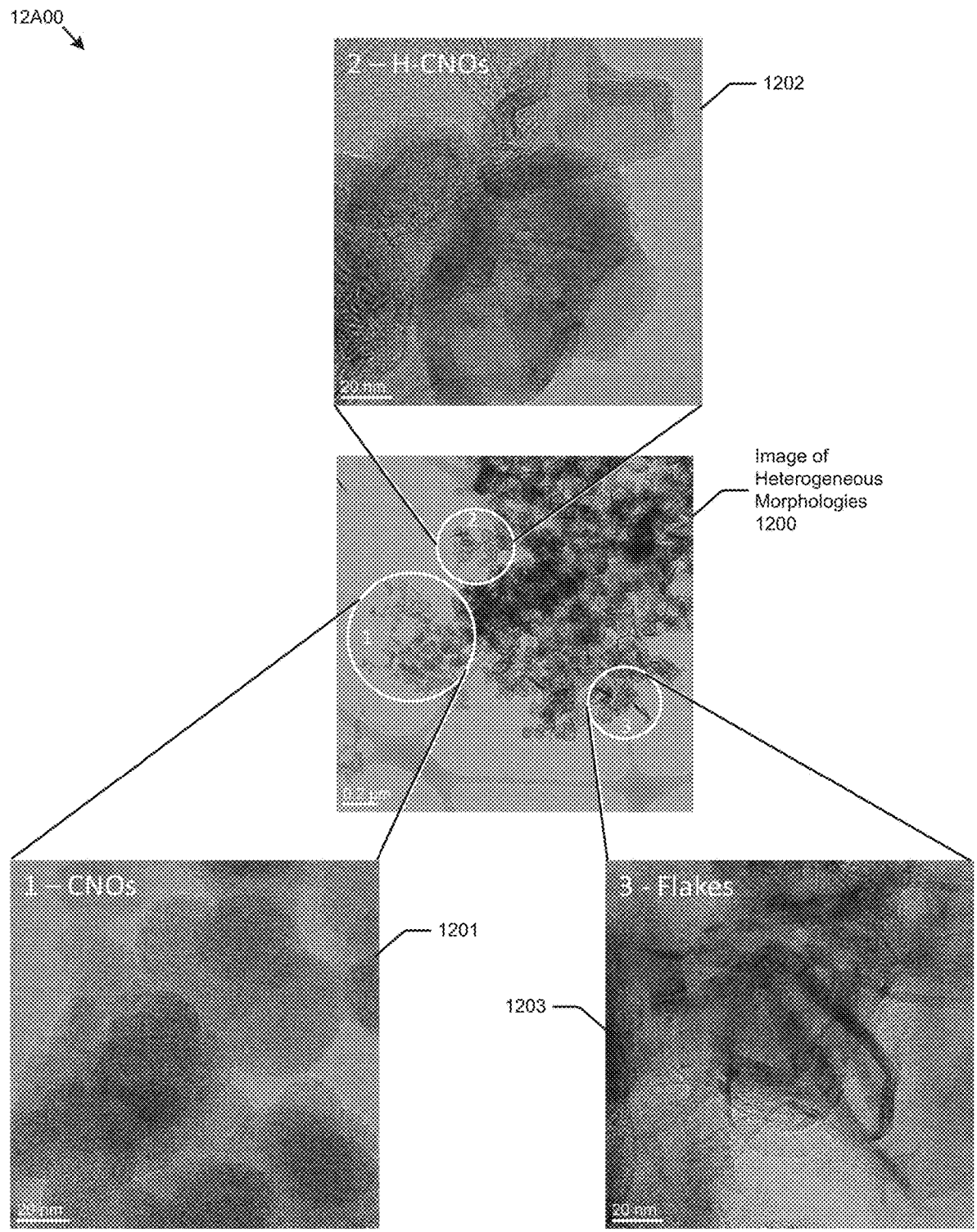
FIG. 12A shows TEM images of a solid material having heterogeneous morphologies, according to some implementations.

FIG. 12A shows TEM images 12A00 of a solid material having a heterogeneous morphology. The image of heterogeneous morphology 1200 depicts an area (circle 1) composed of CNOs, an area (circle 2) composed of H-CNOs, and an area (circle 3) composed of flakes. To illustrate the visible differences in morphology, the figure also presents a magnification of the CNOs (such as image 1201), a magnification of the H-CNOs (such as image 1202), and a magnification of the flakes (such as image 1203).

All three morphological types are blended at a microstructure level in the final solid. The presence of CNO morphology contributes to an increase in the D:G ratio (defects in the platelets structure), a decrease the 2D:G ratio, and lower surface area. This is shown in Table 1 (see column labeled 2D:G Ratio).

Experiment 2: Lower Reactor Pressure

Figure 12B:
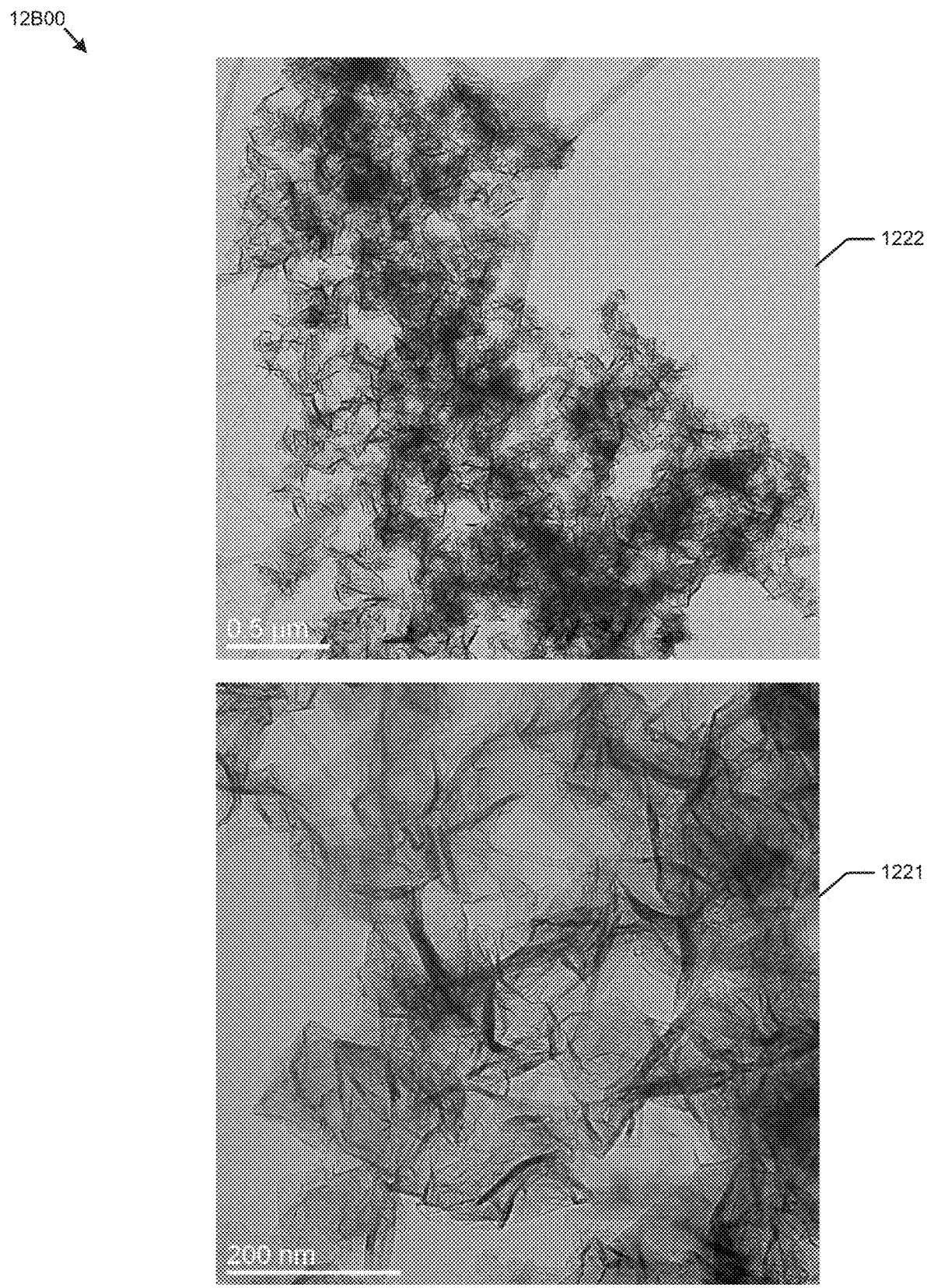
FIG. 12B shows TEM images of a solid material having a homogeneous morphology, according to some implementations.

FIG. 12B presents TEM images 12B00 of a solid material having a homogeneous morphology. Specifically, the TEM images (such as image 1221 at 200 nm scale and image 1222 at 0.5 nm scale) depict homogeneous flaky morphology of solid material that was created under the same gas composition and flow as was used in Experiment 1, but at a lower reactor pressure. An absence of other morphological types besides the flakes is noticeable in the images.

Analysis of Experiment 1 with Respect to Experiment 2

While the solid matter of FIG. 12A and the solid material of FIG. 12B were both produced in the same flow reactor and under identical gas blends and gas flow rates conditions, the differences in internal reactor pressure controlled by the gas-solid separator 232 design resulted in (in some occurrence, very substantial) differences in morphology. The foregoing experiments show that the higher reactor pressure of Experiment 2 created material corresponding to solid matter 'A' (see Table 1) with substantially heterogeneous morphologies being present. Increased internal reactor pressures cause substantial drops in internal reactor temperatures and substantial increases in residence times on paths between a center of plasma chamber and its periphery, creating localized areas away from the center with conditions favoring CNOs and H-CNOs morphologies formation (such as lower temperatures, and shorter or longer residence times respectively).

Alternatively, a much lower reactor pressure allows for tighter control of gases flow contours, and plasma temperatures to enable higher C2* radical ion concentrations under non-equilibrium conditions in the entire plasma chamber, resulting in production of material corresponding to solid matter 'B' (see Table 1) exhibiting a nearly homogeneous multi-layer graphene flake morphology.

Still further, specific platelet diameters, number of platelets in a stack and the distance between them, degree of crystallinity, and three-dimensional assembly of the stacks depends on a combination of the spatial, temporal and temperature variations between the paths, and a plurality of morphologies can arise within a solid matter of gas dissociation.

In some situations, multiple flows of the plasma plume are tuned such that a particular, different morphology results from each flow or path. The particular, different morphologies can be selected based on various functionalization that might be indicated for a particular use or application. To accomplish this, a reactor type can be selected, its plasma plume shape can be controlled as heretofore described, and various flows through the reactor can be controlled so as to generate solid matter of particular one or more morphologies (such as for a particular use or application). Strictly as examples, the reactor can be tuned to produce CNOs, H-CNOs, or graphene flakes.

The foregoing experiments were conducted in a reactor having multiple discrete flows that result from identically sized gas inlets (such as nozzles with identically sized orifices). In other implementations, multiple discrete flows are graduated in discrete increments such that a first flow that arises from a relatively larger orifice is laterally juxtaposed from a second or Nth flow that arises from a relatively smaller orifice. A nozzle to form such flows and a use of such a nozzle is given in FIG. 13A and FIG. 13B.

Figures 13A, 13B:
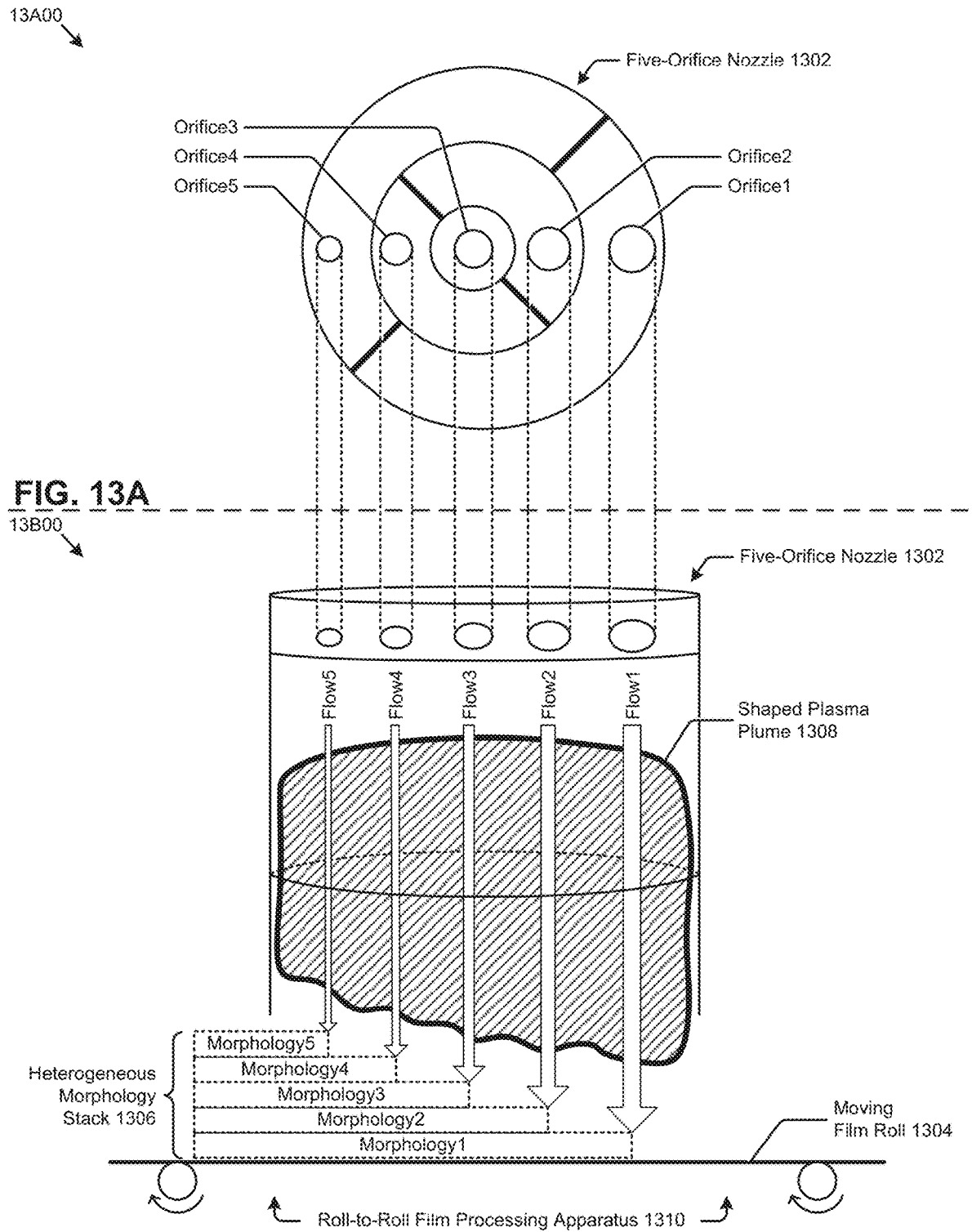
FIG. 13A shows a bottom principal view of a five-orifice nozzle, according to some implementations.
FIG. 13B depicts a plasma reaction chamber having a shaped plasma plume, according to some implementations.

FIG. 13A shows a bottom principal view 13A00 of a five-orifice nozzle 1302. As shown, the nozzle supports five independently controllable flows (such as flow1 through flow5). Each independently controllable flow emits from a corresponding orifice. The flow of a process gas through a particular orifice is controllable using a process gas control unit such as is shown in FIG. 2 (such as first process gas control unit 221, second process gas control unit 222, etc.). The shown five-orifice nozzle 1302 is merely one embodiment of a multiple orifice nozzle that can be used to generate multiple morphologies of solid matter coming out of the reactor. More specifically, a multiple orifice nozzle can be used to generate multiple flows within a reaction chamber, which in turn results in multiple residence paths through the reactor, which in turn generates multiple morphologies of solid matter coming out of the reaction chamber. An example configuration of a reaction chamber that produces multiple morphologies of solid matter out of a single shaped plasma plume is shown and described as pertains to FIG. 13B.

FIG. 13B depicts a plasma reaction chamber 13B00 having a shaped plasma plume 1308. Such a plasma reaction chamber having a shaped plasma plume can be used in combination with a moving substrate (such as moving film roll 1304) to form a heterogeneous morphology stack of materials that is composed of an ordered combination of multiple different resultants from the plasma reaction chamber. Using the shown roll-to-roll film processing apparatus 1310, and atop a substrate (such as a substrate included in or formed by moving film roll 1304), heterogeneous morphology stack 1306 is formed of a first layer of a first morphology (such as morphology1) resulting from the shown Flow1, upon which first layer is formed a second layer of a second morphology (such as morphology2) resulting from the shown Flow2, upon which second layer is formed a third layer of a third morphology (such as morphology3) resulting from the shown Flow3, and so on. Such a technique can be used to form a layered composition of matter where each layer has a successively different set of characteristics that correspond to the different morphologies.

In some situations, the substrate that forms a bottom layer of the moving film roll can serve as a sacrificial layer, which can be removed from the heterogeneous morphology stack 1306. The lowest layer of the heterogeneous morphology stack 1306, shown here as morphology1 can be functionalized for a variety of purposes. Strictly as an example, the lowest layer can be functionalized for adhesion, or the lowest layer can be functionalized for hydrophilicity, or for other purposes, etc.

ADDITIONAL IMPLEMENTATIONS

Figure 14A:
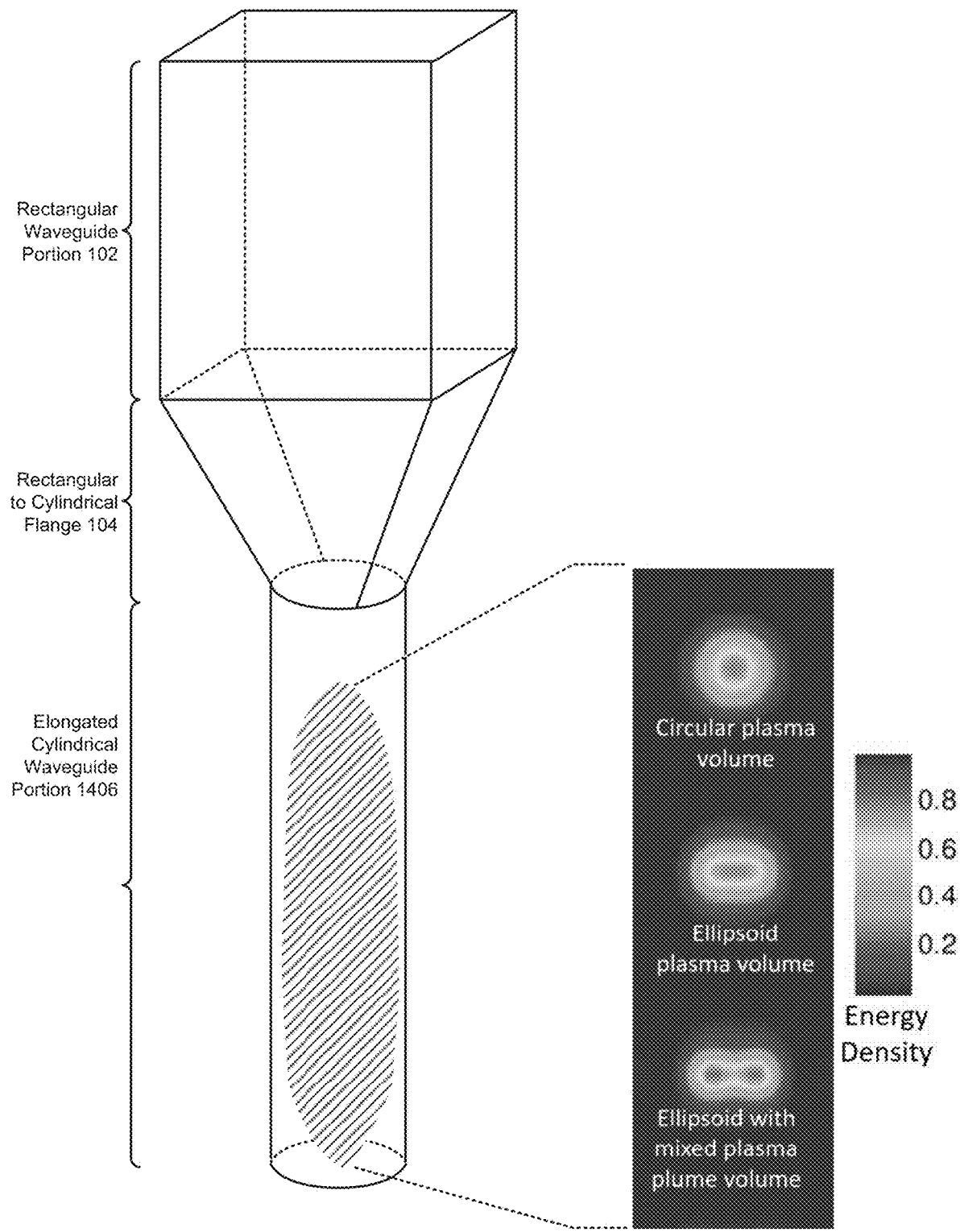
FIG. 14A and FIG. 14B show diagrams of an apparatus configured for shaping a plasma plume, according to some implementations.
Figure 14B:
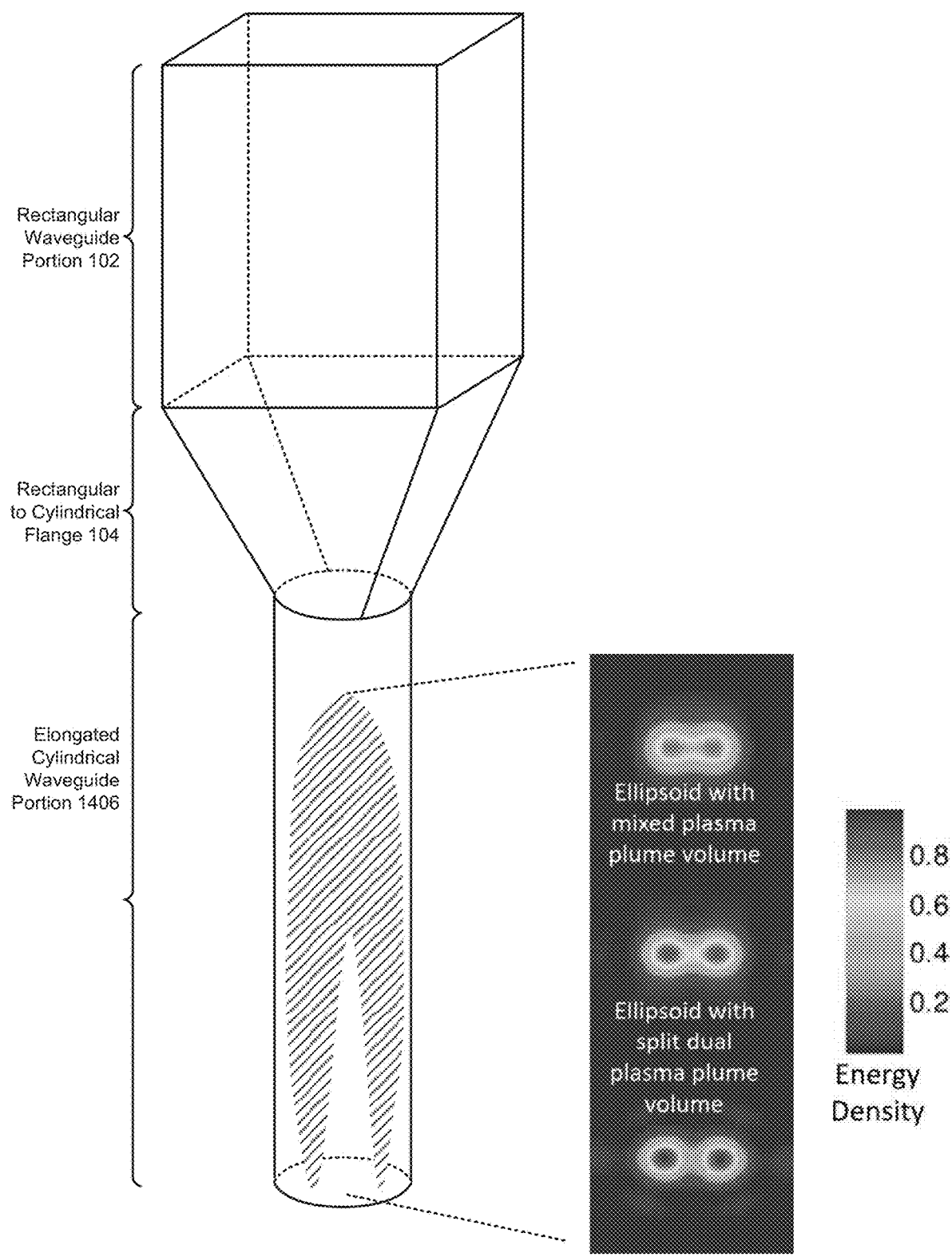

FIG. 14A and FIG. 14B show diagrams of an apparatus that is configured for shaping a plasma plume. Referring again to the apparatus of FIG. 1, the cylindrical portion of the apparatus can be much longer than as depicted in FIG. 1. Specifically, and as shown, the cylindrical portion of the apparatus can have a shape with an aspect ratio that corresponds to the elongated cylindrical waveguide portion 1406 of FIG. 14A. This elongation facilitates shaping the plasma plume in a horizontal dimension so as to substantially fill the volume of the cylindrical portion of the apparatus, thus leading to higher efficiency. The diagram of FIG. 14A depicts several plasma volume shapes. In the heretofore-disclosed implementations, the plasma plume is shaped to fill a substantially cylindrical volume within the cylindrical portion of the reactor. However, other plasma volume types are possible, and in some cases these other plasma volume types correspond to horizontally elongated shapes (such as the shown elliptical plasma volume shape) and/or multi-plume configurations (such as the shown split dual plasma plume volume). In some cases, the horizontally elongated shapes and/or the multi-plume configurations dominate the morphology and formation speed of materials within the reactor.

FIG. 14A is presented strictly as an illustrative example where an ellipsoid plasma shape spreads out the energy delivered into the plasma. This serves not only to generate additional potential plasma ignition points but also to spread out the energy horizontally to increase the plasma priming particle density.

In other configurations, such as is shown in FIG. 14B, two innate energy points yield optimal ignition responses. In still other configurations, the cylindrical portion of the apparatus can be elongated to facilitate a lengthwise longer energy distribution which in turn facilitates plasma volume stability at lower power levels. In still another configuration, this longer lengthwise energy distribution with a corresponding longer lengthwise plasma plume shape is used for specific materials creation. Moreover, this longer lengthwise energy distribution with a corresponding longer lengthwise plasma plume shape can be used as a linear plasma deposition torch system for coating materials. In some situations, such a linear plasma deposition torch system can be used in conjunction with a moving substrate in a roll-to-roll deposition system.

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

In the foregoing specification, the disclosure has been described with reference to specific implementations thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are to be regarded in an illustrative sense rather than in a restrictive sense.

What is claimed is:

1. A system comprising:
    a plasma reactor including a rectangular portion coupled to a cylindrical portion via a rectangular-to-cylindrical portion, the cylindrical portion having a radial center;
    a multi-flow nozzle coupled with the plasma reactor, the multi-flow nozzle including a first inlet and a second inlet arranged in a concentric organization and collectively configured to flow a first gas and a second gas, respectively, into the plasma reactor such that the second gas surrounds the first gas; and
    a microwave energy generator configured to output a microwave energy into the rectangular portion of the plasma reactor as a sinusoidal waveform, wherein:
        the rectangular-to-cylindrical portion of the plasma reactor is configured to convert the microwave energy from the sinusoidal waveform to a radial waveform having an energy maxima at the radial center of the cylindrical portion.

2. The system of claim 1, wherein a location of ignition of a plasma plume within the plasma reactor is based at least in part on the microwave energy.

3. The system of claim 1, further comprising a reactor control unit to control flow of one or more gases through the multi-flow nozzle into at least the cylindrical portion of the plasma reactor.

4. The system of claim 1, wherein the multi-flow nozzle is formed from a material permitting unimpeded transmission of the microwave energy.

5. The system of claim 1, wherein one or more of the first gas or the second gas includes a hydrocarbon-containing gas.

6. The system of claim 1, wherein the multi-flow nozzle includes one more nozzles configured to flow an input material including one or more of a hydrocarbon-containing gas, one or more other compositions of matter, or one or more mixtures into the plasma reactor.

7. The system of claim 1, wherein the multi-flow nozzle is configured to flow one or more of the first gas or the second gas in one or more configurations including an adjacent configuration or a concentric configuration.

8. The system of claim 1, wherein the multi-flow nozzle includes a plurality of jets configured to flow one or more of the first gas or the second gas into the plasma reactor at one or more of a defined pressure or pressure velocity.

9. The system of claim 1, wherein the plasma reactor comprises:
    a plasma chamber; and
    a non-plasma chamber, wherein the multi-flow nozzle is configured to act as a mechanical pressure barrier and prevent plasma created in the plasma chamber from entering the non-plasma chamber.

* * * * *